(12) United States Patent
Hawker et al.

(10) Patent No.: US 10,211,400 B2
(45) Date of Patent: Feb. 19, 2019

(54) PHOTOPATTERNED GROWTH OF ELECTRONICALLY ACTIVE BRUSH POLYMERS FOR LIGHT EMITTING DIODE DISPLAYS

(71) Applicants: The Regents of the University of California, Oakland, CA (US); Rohm and Haas Electronic Materials LLC, Marlborough, MA (US); Dow Global Technologies LLC, Midland, MI (US)

(72) Inventors: Craig J. Hawker, Santa Barbara, CA (US); Zachariah Allen Page, Goleta, CA (US); Peter Trefonas, III, Medway, MA (US); Anatoliy N. Sokolov, Midland, MI (US); John Kramer, Midland, MI (US); David S. Laitar, Midland, MI (US); Sukrit Mukhopadhyay, Midland, MI (US); Benjaporn Narupai, Goleta, CA (US); Christian Wilhelm Pester, Goleta, CA (US)

(73) Assignees: DOW GLOBAL TECHNOLOGIES LLC, Midland, MI (US); ROHM AND HAAS ELECTRONIC MATERIALS LLC, Marlborough, MA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/476,492

(22) Filed: Mar. 31, 2017

(65) Prior Publication Data

US 2018/0287065 A1    Oct. 4, 2018

(51) Int. Cl.
*H01L 51/00* (2006.01)
*C09K 11/06* (2006.01)
(Continued)

(52) U.S. Cl.
CPC .......... *H01L 51/0035* (2013.01); *C09K 11/06* (2013.01); *H01L 51/0043* (2013.01);
(Continued)

(58) Field of Classification Search
CPC ............. H01L 51/0035; H01L 51/0043; H01L 51/5072; H01L 51/5088; H01L 51/5206;
(Continued)

(56) References Cited

U.S. PATENT DOCUMENTS 6,423,465 B1    7/2002    Hawker et al.
6,447,879 B1    9/2002    Sakurai et al.
(Continued)

OTHER PUBLICATIONS

Choi et al.; "Simple Detachment Patterning of Organic Layers and Its Application to Organic Light-Emitting Diodes"; Adv. Mater.; 17, No. 2; Jan. 31, 2005, pp. 166-171.
(Continued)

*Primary Examiner* — Su C Kim
(74) *Attorney, Agent, or Firm* — Cantor Colburn LLP

(57) ABSTRACT

Disclosed herein is a device comprising a substrate; where the substrate comprises a plurality of brush polymers that are covalently or ionically bonded to the substrate; where at least a portion of the brush polymers comprise a covalently bonded emitter moiety.

15 Claims, 10 Drawing Sheets

(51) Int. Cl.
    *H01L 51/50*    (2006.01)
    *H01L 51/52*    (2006.01)

(52) U.S. Cl.
    CPC ............ *C09K 2211/1029* (2013.01); *C09K 2211/185* (2013.01); *H01L 51/0096* (2013.01); *H01L 51/5036* (2013.01); *H01L 51/5056* (2013.01); *H01L 51/5072* (2013.01); *H01L 51/5088* (2013.01); *H01L 51/5206* (2013.01)

(58) Field of Classification Search
    CPC ............ H01L 51/0096; H01L 51/5036; H01L 51/5056; C09K 11/06; C09K 2211/1029; C09K 2211/185
    See application file for complete search history.

(56) References Cited

U.S. PATENT DOCUMENTS

| | | |
|---|---|---|
| 2001/0024738 A1 | 9/2001 | Hawker et al. |
| 2003/0205696 A1 | 11/2003 | Thoms et al. |
| 2004/0260047 A1 | 12/2004 | Chen et al. |
| 2006/0099451 A1* | 5/2006 | Igarashi ............ C09K 11/06 428/690 |
| 2007/0169814 A1 | 7/2007 | Huck et al. |
| 2014/0099580 A1 | 4/2014 | Hawker et al. |
| 2014/0134454 A1* | 5/2014 | Fuchs ............ H01B 5/00 428/620 |
| 2014/0205818 A1* | 7/2014 | Schwartz ............ G03F 7/16 428/201 |
| 2015/0184024 A1 | 7/2015 | Chang et al. |

OTHER PUBLICATIONS

Derue et al.; "All-Solution-Processed Organic Light-Emitting Diodes Based on Photostable Photo-cross-linkable Fluorescent Small Molecules"; ACS Appl. Mater. Interfaces; 8; 2016, pp. 16207-16217.
Gather et al.; "Solution-Processed Full-Color Polymer Organic Light-Emitting Diode Displays Fabricated by Direct Photolithography"; Adv. Funct. Mater.; 17; 2007, pp. 191-200.
Jou et al.; "Approaches for fabricating high efficiency organic light emitting diodes"; J. Mater. Chem. C; 3; 2015; pp. 2974-3002.
Jung et al.; "High performance inkjet printed phosphorescent organic light emitting diodes based on small molecules commonly used in vacuum processes"; Thin Solid Films; 520; 2012, pp. 6954-6958.
Muller et al.; "Multi-colour organic light-emitting displays by solution processing"; Nature; vol. 421;Feb. 20, 2003, pp. 829-833.
Niu et al.; "Full color and monochrome passive-matrix polymer light-emitting diodes flat panel displays made with solution processes"; Organic Electronics; 9; 2008, pp. 95-100.
Oh et al.; "Patterned Taping: A High-Efficiency Soft Lithographic Method for Universal Thin Film Patterning"; ACS Nano; 10; 2016, pp. 3478-3485.
Qiang et al.; "Novel Photo-Crosslinkable Light-Emitting Rod/Coil Copolymers: Underlying Facile Material for Fabricating Pixelated Displays"; Macromol. Rapid Commun.; 27; 2006, pp. 1779-1786.
Shimoda et al.; "Inkjet Printing of Light-Emitting Polymer Displays";MRS Bulletin; Nov. 2003; pp. 821-827.
Tao et al.; "Organic host materials for phosphorescent organic light-emitting diodes"; Chem. Soc. Rev; 40; 2011, pp. 2943-2970.
Zheng et al.; "All-solution processed polymer light-emitting diode displays"; Nature Communications; 4; 2013, pp. 1-7.

* cited by examiner

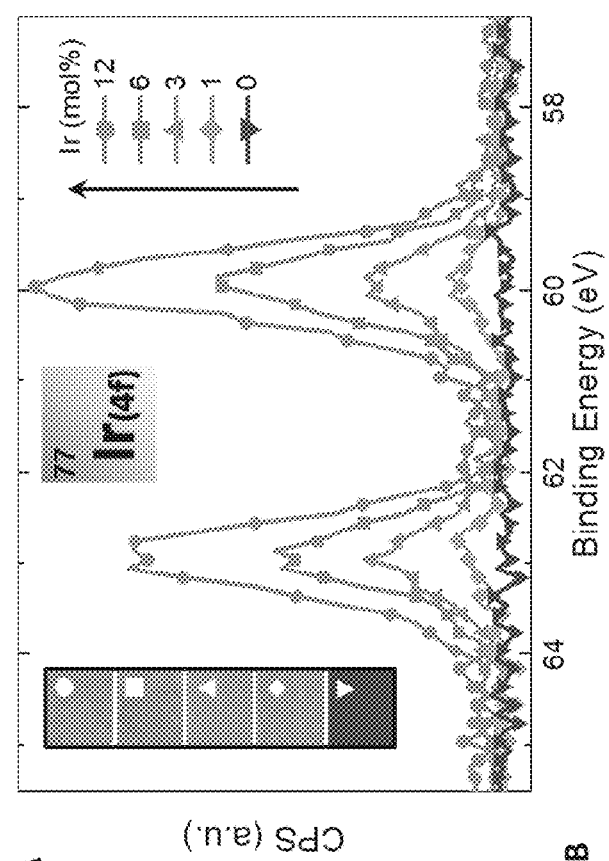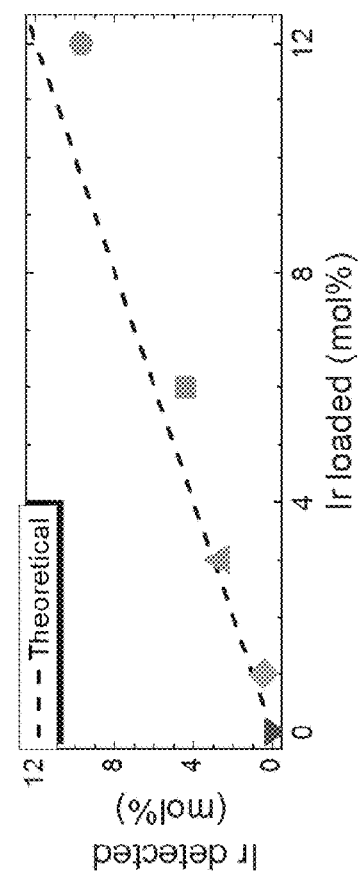
FIG. 3A
FIG. 3B

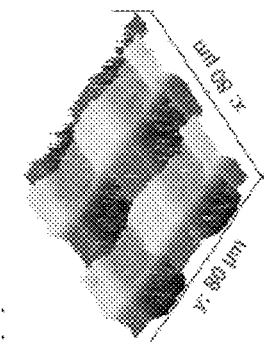
FIG. 5B
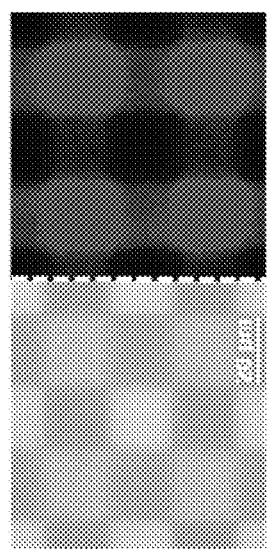
FIG. 5A
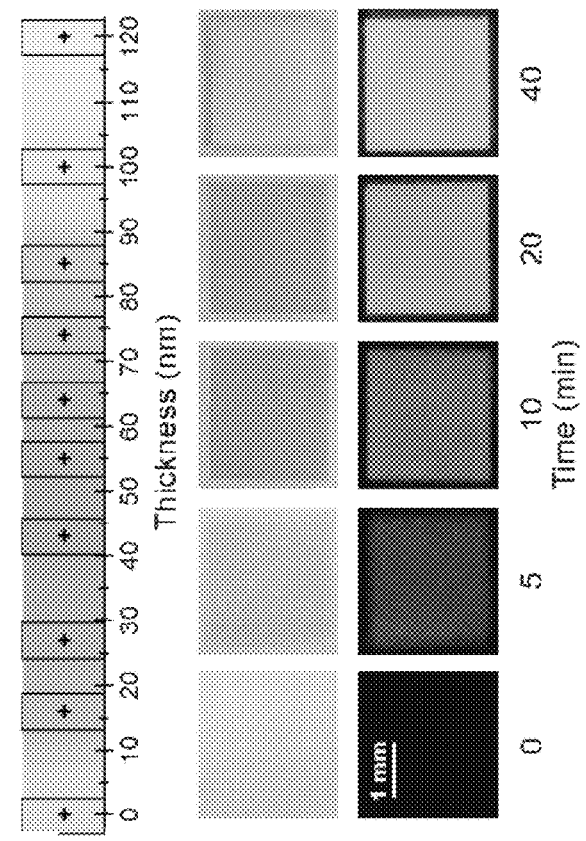
FIG. 5C
FIG. 5D

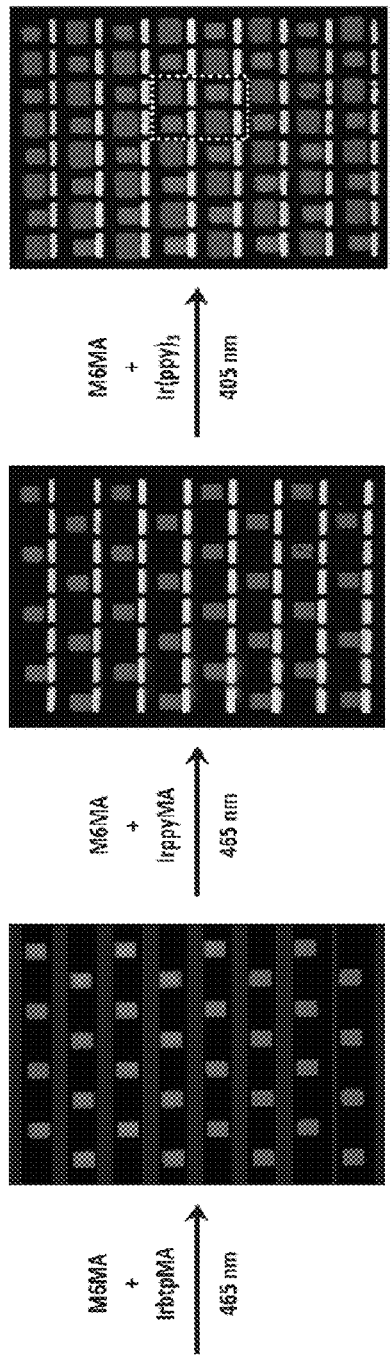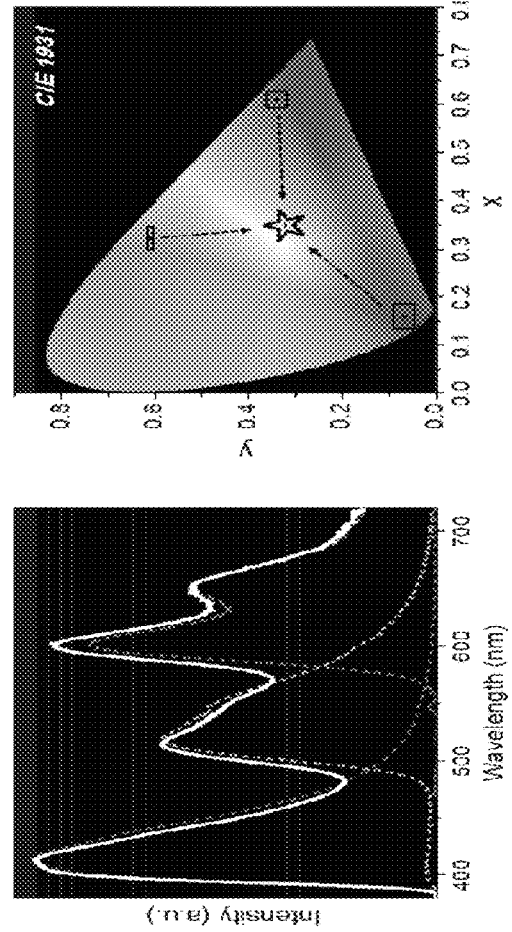
FIG. 7A
FIG. 7B
FIG. 7C
FIG. 7D

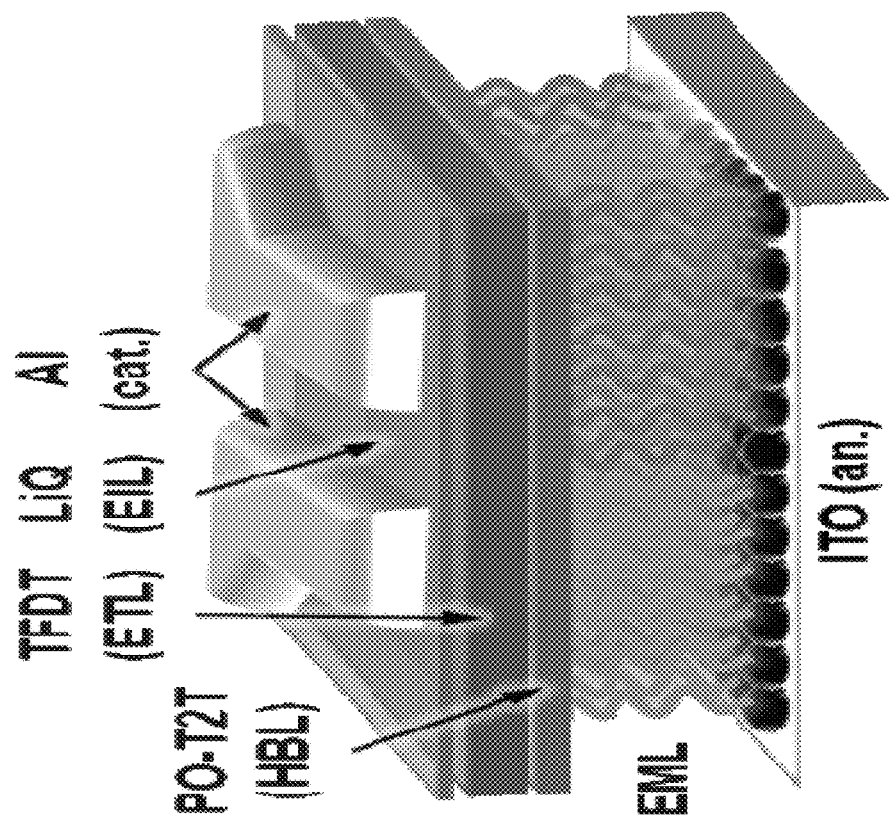
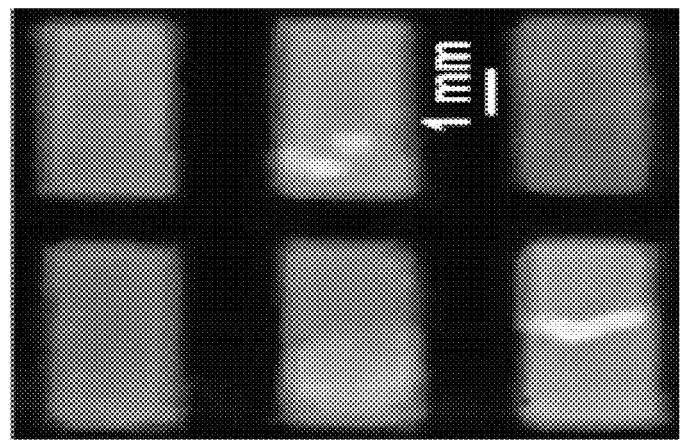
FIG. 8A
FIG. 8B

PHOTOPATTERNED GROWTH OF ELECTRONICALLY ACTIVE BRUSH POLYMERS FOR LIGHT EMITTING DIODE DISPLAYS

BACKGROUND

This disclosure relates to photopatterned growth of electronically active brush polymers for light emitting diode displays.

Display devices have become an integral part of society as a means of information transfer. In particular, organic light emitting diode (OLED) displays are among the most energy efficient 2D display technologies and can be found in everyday appliances, including smartphones, laptops, and televisions. Two aspects that have made efficient OLED displays possible are the use of phosphorescent materials and multi-colored pixel arrays. However, the energy efficiency of OLED displays is offset by the cost of production, in part, due to the use of evaporative deposition processes. Solution-based methods are attractive alternatives that grant access to low-cost large area and high throughput fabrication (e.g., spin-coating, ink-jet printing, roll-to-roll, and the like), but suffer from limited patterning capabilities. Thus, a simple method to generate patterned phosphorescent OLEDs from solution is particularly desirable.

The use of organic and organometallic phosphors have been critical useful to OLED device performance as a means to harness energy from triplets states, which are electronically generated in a 3:1 ratio with singlet states. Therefore, while fluorescent materials (singlet emitters) are theoretically limited to an internal quantum of efficiency (IQE) of about 60%, phosphorescent materials (triplet emitters) provide a theoretical IQE maximum of 100%. The incorporation of heavy transition metal ions (e.g., Ir(III), Pt(II), Os(II), Au(III), Ru(II), and Cu(I)) in organic complexes has proven to be one of the most effective methods to generate phosphorescent materials. This is due to their intrinsically strong spin-orbit coupling (SOC) that promotes intersystem crossing (ISC), which, when coupled with metal-to-ligand charge-transfer (MLCT), results in the radiative release of triplet energy. Iridium (III) complexes are the most commonly utilized organometallic phosphors in OLEDs due to their impressive photoluminescence quantum yield (PLQY), stability, short triplet state lifetimes, and spectral tunability from blue to near infrared. Additionally, to suppress inherent concentration quenching and triplet-triplet annihilation, these complexes are added as hosts and/or emitters into semiconducting host matrices, where covalent attachment to the host mitigates phase separation over time to further improve device longevity.

One popular option for display technology relies on the use of white light to render colored images through the use of color filters or color conversion techniques. In another method, white OLEDs are obtained by blending red, green, and blue emission, using a variety of device architectures and pixel layouts. For example, Samsung has used a PenTile RGBG array of red, green, and blue rectangular pixels to achieve white emission for the Nexus One smartphone display. Alternatively, pixels with a reasonable facsimile of white appearance can be obtained by blending other colors, for example, sky-blue and yellow-orange. Such pixel patterns layouts are achieved industrially using thermal evaporation of small molecules through a shadow-mask under high vacuum, which is both expensive and time-consuming on large-scale. Although researchers have developed a number of methods to achieve emissive patterned arrays from solution, including, screen printing, contact lithography, jet printing, and photocrosslinking, practical limitations such as fabrication complexity, lack of triplet state emission, scalability issues, and the use of undesirable reagents have prevented commercialization. For example, printing and contact lithography techniques require use either complex equipment or numerous iterative processing steps to achieve the desired pattern, while photocrosslinking has been used to more rapidly provide fluorescent semiconducting patterns through step-wise spin-coating/irradiation cycles. However, for photocrosslinking intense ultraviolet (UV) radiation is often used, along with the use of radical or cationic photoinitiators (e.g., cyclopentadienyl titanium or iodonium hexafluoroantimonate derivatives), that contaminate the emissive layer (EML) in an OLED device.

It is therefore desirable to have OLED displays that can be manufactured without the use of complex equipment or numerous iterative processing steps to achieve a desired pattern.

SUMMARY

Disclosed herein is an article comprising a substrate; a first region having a first brush polymer chemically bonded to the substrate; where the first brush polymer comprises repeat units of a first ethylenically unsaturated monomer and a second ethylenically unsaturated monomer; where the first ethylenically unsaturated monomer comprises a first electroactive moiety and where the second ethylenically unsaturated monomer comprises a second electroactive moiety that is different from the first electroactive moiety; where at least one of the first electroactive moiety or the second electroactive moiety is an emitter moiety and where the repeat units of the first ethylenically unsaturated monomer are covalently bonded to repeat units of the second ethylenically unsaturated monomer.

Disclosed herein too is a method comprising disposing on a first region of a functionalized substrate a first composition comprising a first ethylenically unsaturated monomer and/or a second ethylenically unsaturated monomer and a solvent; where the first ethylenically unsaturated monomer comprises a first electroactive moiety and where the second ethylenically unsaturated monomer comprises a second electroactive moiety; irradiating the first region with ultraviolet radiation and/or visible light; photo-catalyzing the polymerization of the first ethylenically unsaturated monomer and the second ethylenically unsaturated monomer to form a first brush polymer; and reactively bonding the brush polymer to the substrate; where the first electroactive moiety is different from the second electroactive moiety and where at least one of the first electroactive moiety or the second electroactive moiety is an emitter moiety.

Disclosed herein is a device comprising a substrate; where the substrate comprises a plurality of brush polymers that are covalently or ionically bonded to the substrate; where at least a portion of the brush polymers comprise a covalently bonded emitter moiety.

BRIEF DESCRIPTION OF THE DRAWING

These and/or other aspects will become apparent and more readily appreciated from the following description of the exemplary embodiments, taken in conjunction with the accompanying drawings in which:

FIG. 3A depicts the XPS (X-ray photoelectron spectroscopy) that was used to determine the chemical composition of the five different films;

FIG. 3B is a graph that shows that the atomic percent of Ir, relative to carbon, oxygen, and nitrogen, is in good agreement with theoretical values;

FIG. 5A shows reflectance (left) and photoluminescence (right) images of 2 20×200 μm lines grown for different lengths of time (40 and 60 min. for horizontal and vertical, respectively) and interwoven to provide different heights (43, 55, and 85 nm for horizontal, vertical, and intersection, respectively);

FIG. 5B depicts a 3D topographical image of a pattern obtained using AFM;

FIG. 5C shows correlation between reflectance color and brush thickness; boxed regions are images of sections measured with AFM and regions between are generated color gradients;

FIG. 5D shows reflectance (top) and photoluminescence (bottom) images of copolymer brush squares at different time intervals, with 6 mol % IrppyMA used as catalyst/emitter;

FIG. 7A shows photoluminescence images ($\lambda_{ex}$=365 nm) of the three step RGBG array fabrication, going from red (poly(M6MA-co-IrbtpMA); 500×500 μm), to green (poly (M6MA-co-IrppyMA); 125×750 μm), to blue (poly (M6MA); 500×750 μm) pixels;

FIG. 7B shows a photoluminescence microscopy image ($\lambda_{ex}$=365 nm) showing a magnification of the final pixelated sample (as indicated by the dotted white box in "FIG. 7A");

FIG. 7C shows a photoluminescence profile of the pixel array overlaid with individual red, green, and blue emission profiles;

FIG. 7D depicts CIE 1931 coordinates for the sum emission profile shown as the white trace in "FIG. 7C" along with the individual red, (x,y)=(0.61,0.34), green, (x,y)=(0.32, 0.61), and blue, (x,y)=(0.16,0.07), coordinates;

FIG. 8A provides a schematic representation of the multicolored device;

FIG. 8B is an image showing electroluminescence of device under forward bias;

DETAILED DESCRIPTION

Figure 1:
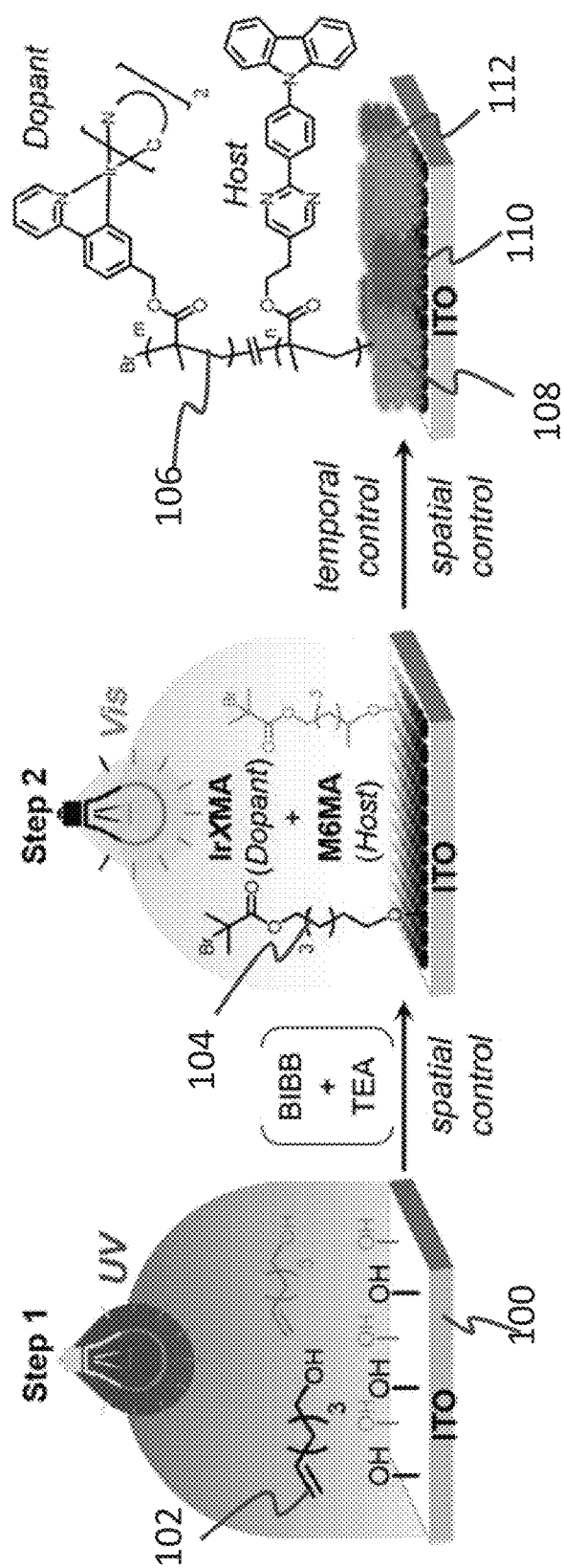
FIG. 1 depicts a general exemplary reaction scheme that is used in preparing the light emitting diode display.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting. As used herein, the singular forms "a," "an," and "the" are intended to include the plural forms as well, unless the context clearly indicates otherwise. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

It will be understood that, although the terms first, second, third, and so on, may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "substituted" refers to a group or compound wherein at least one of the hydrogen atoms thereof is substituted with a halogen atom (F, Cl, Br, or I), a hydroxy group, a nitro group, a cyano group, an amino group, an azido group, an amidino group, a hydrazino group, a hydrazono group, a carbonyl group, a carbamoyl group, a thiol group, an ester group, a carboxylic acid group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof. Deuterated versions of the aforementioned groups are also contemplated herein.

As used herein, when a definition is not otherwise provided, the term "hetero" refers to a compound or group including 1 to 4 heteroatoms selected from N, O, S, Se, Te, Si, B, Al, Be and P.

As used herein, when a definition is not otherwise provided, the term "alkyl" group refers to a straight or branched chain saturated aliphatic hydrocarbon having the specified number of carbon atoms, and having a valence of at least one, optionally substituted with one or more substituents where indicated, provided that the valence of the alkyl group is not exceeded.

As used herein, when a definition is not otherwise provided, the term "alkenyl" group refers to a straight or branched chain hydrocarbon that comprises at least one carbon-carbon double bond, having the specified number of carbon atoms, and having a valence of at least one, optionally substituted with one or more substituents where indicated, provided that the valence of the alkenyl group is not exceeded.

As used herein, when a definition is not otherwise provided, the term "alkynyl" group refers to a straight or branched chain, monovalent hydrocarbon group having at least one carbon-carbon triple bond, having the specified number of carbon atoms, and having a valence of at least one, optionally substituted with one or more substituents where indicated, provided that the valence of the alkynyl group is not exceeded.

As used herein, when a definition is not otherwise provided, the alkyl group, the alkenyl group, or the alkynyl group may be linear or branched. Examples of the alkyl group may be a methyl group, an ethyl group, an iso-propyl group, a tert-butyl group, a n-octyl group, a n-decyl group, a n-hexadecyl group, and the like. Examples of the alkenyl group may be a vinyl group, an allyl group, a 2-butenyl group, or 3-pentenyl group. Examples of the alkynyl group may be a propargyl group, or a 3-pentynyl group.

As used herein, when a definition is not otherwise provided, the term "cycloalkyl" group refers to a group that comprises one or more saturated and/or partially saturated rings in which all ring members are carbon, such as cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl) or cycloalkynyl groups, and having a valence of at least one, and optionally substituted with one or more substituents where indicated, provided that the valence of the alkyl group is not exceeded.

As used herein, when a definition is not otherwise provided, the term "aryl" group refers to a cyclic group in which all ring members are carbon and at least one ring is aromatic, the group having the specified number of carbon atoms, for example a C6 to C30 aryl group, and specifically a C6 to C18 aryl group, and having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant, spirocyclic, or a combination thereof.

As used herein, when a definition is not otherwise provided, the term "amino group" refers to —NRR' wherein R and R' are independently hydrogen, a C1 to C20 alkyl group, or a C6 to C30 aryl group.

As used herein, when a definition is not otherwise provided, the term "siloxane" refers to a compound or polymer and a divalent radical of the formula —[Si(R)(R')O]— wherein R and R' are independently hydrogen, a substituted or unsubstituted C1 to C30 alkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C3 to C30 heteroaryl group, a substituted or unsubstituted C2 to C30 alkenyl group, a substituted or unsubstituted C1 to C30 alkoxy group, or a hydroxy group.

As used herein, the term "hydrogen" or "H" describes the atom containing a single proton, and is inclusive of "deuterium" or "D".

As used herein, the term "electroactive moiety" describes a chemical functional group which is capable of transporting an electrical charge and has at least one aromatic ring, preferably two or more aromatic rings, and preferably three or more aromatic rings that are conjugated. In an embodiment, the electroactive moiety comprises a plurality of aromatic rings that are conjugated. The electrical charge can be either a positive charge or a negative charge. More specifically, as used herein, the term "electroactive moiety" describes a chemical functional group capable of transporting an electrical charge at an applied potential between −25 volts and +25 volts.

As used herein, the term "emitter" describes a light emitting chemical functional group which is capable of accepting an electron and hole (if the recombination directly happens on the emitter) or an exciton (the bound state of a hole and an electron) and emitting a photon through the spontaneous decay of the exciton. Usually the emitter comprises an organometallic moiety, and more usually comprises an organometallic complex. In many cases, the organometallic moiety comprises a heavy metal atom, such as Ir or Pt.

As used herein, the term "host" describes an electroactive chemical functional group which is capable of accepting and transporting electrons and holes and forming excitons (electron-hole pairs) and then transferring the exciton to an emitter via Förster and Dexter energy transfer processes. Generally, in order to facilitate Förster transfer, the emission spectrum of the host matrix needs to overlap significantly with the absorption spectrum of the dopant, whereas efficient Dexter transfer requires the match of energies of the singlet and triplet excitons on the host with the exciton energies on the emitter group. In some cases, an offset of the HOMO and LUMO energies between the host and emitter material may be introduced to facilitate direct charge trapping with phosphorescent emitters. Generally, to achieve efficient electrophosphorescence some considerations of the host group include possessing higher triplet energies than those of the emitter groups to prevent reverse energy transfer from the emitter back to the host, as well as improve confinement of triplet excitons in the emissive material; matching the highest occupied molecular orbitals (HOMOs) and the lowest unoccupied molecular orbitals (LUMOs) of host groups with those of neighboring charge conduction layers to reduce the hole and electron injection barriers, thus lowering the device driving voltages; good and balanced charge carrier transport properties for the hole-electron recombination processes; and chemical and thermal stability. Generally, the molecular structure of host usually incorporates either hole or electron transport moieties, and in another design consideration, the host may be bipolar which means the molecular structure of host incorporates both hole and electron transport moieties.

The species used to catalyze a photopolymerization may be called a photocatalyst. In some cases the emitter can also be a photocatalyst. The term photocatalyst describes a chemical functional group that accelerates the polymerization of ethylenically unsaturated monomers while exposed to light. In an embodiment, the photocatalyst may be used in an amount of 5 mole percent or less based on a total number of moles of the first ethylenically unsaturated moiety and a second ethylenically unsaturated moiety.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C20 alkyl" refers to a C1 to C20 alkyl group substituted with a C6 to C20 aryl group, the total number of carbon atoms in the resulting aryl substituted alkyl group is C7 to C40.

A brush polymer comprises a polymeric chain backbone and has an electroactive moiety extending radially outwards from the chain backbone. The electroactive moiety is linked to the chain backbone by a covalent bond, an ionic bond or a hydrogen bond. The chain backbone of the brush polymer is covalently or ionically bonded to a substrate. The electroactive moiety may be a host material, a hole transport layer material (HTL), a hole injection layer material (HIL), an emitter material, an electron transport layer (ETL), or the like.

Disclosed herein are color-emitting materials that comprise electronically active brush polymers (hereinafter "brush polymer) that are functionalized on a substrate surface. The color-emitting materials may be use in a variety of articles (e.g., in displays or in components for displays). The article is photo-patterned to have one or more regions that emit light of different wavelengths when activated by visible light. In an embodiment, the article comprises a substrate upon which is covalently or ionically bonded an emitting moiety. The emitting moiety comprises a polymeric backbone to which is covalently bonded an electroactive moiety. The electroactive moiety functions as an emitter. The emitter is a substituent that is covalently or ionically bonded to the polymeric backbone to form an electronically active brush polymer. The electroactive moiety may function as a host material, a hole transport layer material (HTL), a hole injection layer material (HIL), an emitter material, an electron transport layer material (ETL), or the like.

In one embodiment, the brush polymer comprises a homopolymer (that is covalently or ionically bonded to the substrate) that comprises a first polymer that has a first polymer backbone onto which is grafted a first electroactive moiety. In an embodiment, the first electroactive moiety may be a host moiety. The homopolymer contains no emitter moiety. In another embodiment, the brush polymer comprises a random or block copolymer that comprises a first polymer that has a first polymer backbone onto which is grafted a first electroactive moiety and a second polymer covalently bonded to the first polymer) onto which is grafted a second electroactive moiety. The first electroactive moiety is chemically different from the second electroactive moiety. In an embodiment, the first electroactive moiety and the second electroactive moiety are different from each other and are selected from the group consisting of a host moiety, a hole transport layer moiety (HTL), a hole injection layer moiety (HIL), an emitter moiety, or an electron transport layer moiety (ETL). In an exemplary embodiment, at least one of the first electroactive material or the second electroactive moiety comprises an emitter moiety.

The first polymer is reactively bonded (covalently or ionically bonded) to the substrate. In the block or random copolymer, the first electroactive moiety may be a host moiety, while the second electroactive moiety is an emitter moiety. In an embodiment, the host and emitter moieties are randomly distributed along the polymer backbone.

In an embodiment, the substrate (with the brush polymers reactively bonded thereto) may be used as on organic light emitting diode. In an embodiment, different regions of the substrate may contain one or more electronically active brush polymers that upon activation emit light of differing wavelengths. The resultant light that is visible from the display is the combination of light of different wavelengths emanating from these different regions. In addition to the light emitting block or blocks in the electronically active brush polymer, the polymer may also contain one or more blocks that facilitate charge transport and injection including hole and electron injection. The display comprises a functionalized substrate to which is covalently or ionically bonded the brush polymer.

In an embodiment, the display comprises a first region having a first brush polymer that emits light of a first wavelength, a second region having a second brush polymer that emits light of a second wavelength, a third region having a third brush polymer that emits light of a third wavelength, and so on. The first, second and the third brush polymer are all reactively bonded (covalently bonded or ionically bonded via an end group) to the substrate. In an embodiment, the display contains three different regions that emit light of three different wavelengths respectively. The display may contain a plurality of these different regions. In an embodiment, the light emanating from the different regions combine to produce white light.

In another embodiment, one or more of the first region, the second region or the third region may each comprise the first brush polymer that emits light of a first wavelength, the second brush polymer that emits light of a second wavelength and/or the third brush polymer that emits light of a third wavelength. In yet another embodiment, a single region on the substrate may comprise the first brush polymer that emits light of a first wavelength, the second brush polymer that emits light of a second wavelength and/or the third brush polymer that emits light of a third wavelength.

In one embodiment, the first brush polymer is a homopolymer that comprises a graft that comprises an electroactive moiety, while the second brush polymer and the third brush polymer each comprise a random copolymer that comprises two or more polymers—a first polymer and a second polymer each of which contain a graft. Some of the grafts on the second brush polymer and the third brush polymer comprise electroactive moieties that are different from each other (e.g., and can comprise host moieties, HTLs, HILs, emitter moieties, or the like). As noted above, one electroactive moiety on the second and/or third brush polymer may a host moiety while the other may be an emitter moiety.

In an embodiment, the first brush polymer comprises a graft that functions as a host, while the second brush polymer and the third brush polymer each comprise a random copolymer that comprises two or more polymers—a first polymer and a second polymer each of which contain a graft. The graft is a pendent moiety that is covalently or ionically bonded to the polymer chain backbone.

The graft on the first brush polymer functions as a host while the graft on the second brush polymer functions as an emitter. The host and/or the emitter on the second brush polymer and on the third brush polymer are different from one another, which enables them to produce different colors. The emitters on the second brush polymer and on the third brush polymer can interact with the host on the first, second or third brush polymers.

In short, the electronically active brush polymer comprises either a host or an emitter-host emissive pair that makes the brush polymer suitable for use in an organic light emitting device. The light emitting diode display therefore comprises a substrate onto which is disposed (reactively bonded as in covalently bonded and/or ionically bonded) a host emissive layer and an emitter-host emissive layer. In an embodiment, the emissive layer is formed by a plurality of emitter-host emissive pairs that are bonded to the backbone of the brush polymer. In an embodiment, additional layers may be placed on top of the electroactive brush polymer either through further polymerization or through a sublimation process. These layers include a hole-transport layer (HTL), an electron-transport layer (ETL), an electron injection layer (EIL), and a cathode.

These additional layers may also be obtained by grafting onto the polymer backbone a hole-transport moiety, an electron-transport moiety and/or an electron injection moiety. For example, a hole-transport layer may be produced below the host emissive layer by grafting onto a portion of the respective brush polymer backbones a hole-transport moiety. The same polymer backbone may then have grafted onto it a host moiety, followed by a graft that comprises an emitter moiety. This is discussed later in the section on displays.

Disclosed herein too is a method for manufacturing light emitting diode displays that comprise the electronically active brush polymer. The method comprises photo-patterning the substrate during the growing of brush polymers directly on different regions of the substrate. The surface of the different regions of the substrate are functionalized prior to growing the brush polymers on them. The brush polymers are covalently bonded or ionically bonded to the substrate. The electronically active brush polymers are reacted with an initiator functionalized substrate surface using light thus permitting the development of emissive layers with three-dimensional patterning. This technology represents a practical and inexpensive method to produce organic light emitting diode (OLED) displays where the photocatalyst used for polymer growth may also serve as an active component in the emissive layer. The main advantage of this method is the spatiotemporal control of the emissive layer, providing access to multiple colors, block copolymer architectures and the potential for display applications. This technique can be used to develop layers with different heights. The solution processable OLED device stack has blue common layer and its architecture is different from evaporative red-green-blue (RGB) pixels.

In an embodiment, the display comprises a substrate, which has a first region having a first brush polymer disposed on the substrate. The first brush polymer comprises repeat units of a first ethylenically unsaturated monomer and/or a second ethylenically unsaturated monomer; where the first ethylenically unsaturated monomer comprises a first electroactive moiety and where the second ethylenically unsaturated monomer comprises a second electroactive moiety. It also comprises a second region having a second brush polymer disposed on the substrate; where the second brush polymer comprises repeat units of a first ethylenically unsaturated monomer and a second ethylenically unsaturated monomer; where the first ethylenically unsaturated monomer comprises a third electroactive moiety and where the second ethylenically unsaturated monomer comprises a fourth electroactive moiety. The second ethylenically unsaturated monomer is operative to photo-catalyze a polymerization of the first ethylenically unsaturated monomer in the first region and in the second region. The first and the second electroactive moieties are different from each other and the third and the fourth electroactive moieties are different from each other.

In an embodiment, the first electroactive moieties and the third electroactive moieties each comprise a host moiety, while the second and fourth electroactive moieties each comprise an emitter moiety.

In an embodiment, a first composition comprising a first ethylenically unsaturated monomer and/or a second ethylenically unsaturated monomer and a solvent are disposed on the substrate in a first region. While the first region can be irradiated, the other regions (e.g., the second region and the third region) are protected from radiation by a photomask. The substrate is irradiated to trigger a polymerization of the first ethylenically unsaturated monomer and/or the second ethylenically unsaturated monomer to form a first brush polymer in the first region. In an embodiment, the first brush polymer comprises a first host and/or a first emitter. Additional blocks may be grown before or after the emissive block. These blocks are the result of grafting different moieties onto the backbone of the same graft polymer.

The photomask is then moved exposing a second region (while covering all other regions of the substrate) onto which a second composition comprising a first ethylenically unsaturated monomer and/or a second ethylenically unsaturated monomer and a solvent are disposed and irradiated to form the second brush polymer. The second polymer comprises a second host and/or a second emitter. It is to be noted that the first ethylenically unsaturated monomer and/or a second ethylenically unsaturated monomer that are disposed on the second region may also be referred to as a third ethylenically unsaturated monomer and/or a fourth ethylenically unsaturated monomer. However, for purposes of simplicity, these will continue to be termed the first ethylenically unsaturated monomer and/or the second ethylenically unsaturated monomer. Each region will therefore have disposed thereon a first ethylenically unsaturated monomer and/or the second ethylenically unsaturated monomer even though these unsaturated monomers may have different chemical structures in different regions of the substrate.

During irradiation, the photocatalyst leads to the generation of radicals which initiates polymerization of the first ethylenically unsaturated monomer and/or the second ethylenically unsaturated monomer. This is termed photocatalysis. Photocatalysis is the catalysis of the reaction driven by electromagnetic radiation, preferably by the absorption of the radiation. The photocatalyst may or may not end up being a part of the brush polymer. In an embodiment, the photocatalyst does not become a part of the brush polymer. Such a photocatalyst may only facilitate polymerization of the monomer without becoming a part of the brush polymer. Examples of catalysts that facilitate polymerization without being incorporated into the brush polymer include phenothiazine and Ir(ppy)3 {Tris[2-phenylpyridinato-C2,N]iridium (III)}.

It is to be noted that the substrate may comprise a third region, a fourth region, and so on, having a third brush polymer and a fourth brush polymer disposed thereon respectively, where the third brush polymer contains a third host and a third emitter and the fourth brush polymer contains a fourth host and a fourth emitter.

In an embodiment, the first region, the second region and/or the third region may comprise a first brush polymer, a second brush polymer and/or a third brush polymer, where each brush polymer has different emitters and/or hosts from the other brush polymers in a given region. In an embodiment, the first region has a first brush polymer disposed on the substrate; where the first brush polymer comprises repeat units of a first ethylenically unsaturated monomer and/or a second ethylenically unsaturated monomer; where the first ethylenically unsaturated monomer comprises a first electroactive moiety (e.g., the first host) and where the second ethylenically unsaturated monomer comprises a second electroactive moiety (e.g., the first emitter). The first region further comprises repeat units of a first ethylenically unsaturated monomer and/or a second ethylenically unsaturated monomer; where the first ethylenically unsaturated monomer comprises a third electroactive moiety (e.g., the second host) and where the second ethylenically unsaturated monomer comprises a fourth electroactive moiety (e.g., the second emitter); where the first electroactive moiety is different from the second electroactive moiety and where the third electroactive moiety is different from the fourth electroactive moiety.

FIG. 1 depicts a general exemplary reaction scheme that is used in preparing the light emitting diode display. A substrate 100 comprising a semiconducting or conducting material is first cleaned and functionalized with an oligomeric or polymeric moiety 102 that is capable of being reacted with an ATRP initiator to form an ATRP initiator functionalized moiety 104. The ATRP initiator functionalized moiety 104 is then reacted with a first ethylenically unsaturated monomer that contains a first pendent electroactive moiety (e.g., a carbazole moiety) that can function as a host and a second ethylenically unsaturated monomer that contains a second pendent electroactive moiety (e.g., an iridium based complex) that can functions as an emitter to form the brush polymer 106.

While the brush polymer 106 shown in the FIG. 1 is a block copolymer comprising two different blocks, the substrate 100 may contain a brush polymer that has only a single block. As detailed above, the substrate may have different regions that contain different brush polymers. In an embodiment, the substrate may be photo-patterned into a first region 108, a second region 110 and a third region 112. Each region contains different brush polymer which enables it to emit light of a different color. Each brush polymer is covalently bonded to the substrate. The brush polymers do not contain amino acids.

In the first region 108 (which emits light of a first wavelength), the ATRP initiator functionalized moiety 104 is then reacted with a first ethylenically unsaturated monomer that comprises a first electroactive moiety (e.g., a carbazole moiety) to produce the first brush polymer, while the second region 110 (which emits light of a second wavelength) and the third region 112 (which emits light of a third wavelength) is surface reacted with a first ethylenically unsaturated monomer that contains a first electroactive moiety (e.g., a carbazole moiety) a second electroactive moiety (e.g., an iridium based complex) to produce second and third brush polymers. The first and the second electroactive moieties in each of the regions are different from each other. In addition, the first electroactive moiety in the second region may be the same or different from the first electroactive moiety in the third region. The second electroactive moiety in the second region may be the same or different from the third electroactive moiety in the third region. It is to be noted that (for purposes of identification and simplicity) the first and second electroactive moieties in the second region are referred to as the third electroactive moiety and the fourth electroactive moiety respectively, and in the third region these are referred to as the fifth electroactive moiety and the sixth electroactive moiety respectively. In order to produce light of different wavelengths from the second region and from the third region, the second brush polymer is chemically different from the third brush polymer. This will be discussed in detail later.

The substrate can be any suitable electrically conducting or electrically semiconducting substrate material that is functionalized in a way that a polymer can be grown from or grafted to a surface of the substrate. The substrate may be a conventional substrate that is used in an organic light-emitting device, such as glass substrate or a transparent plastic substrate. Examples of substrates include silicon dioxide ($SiO_2$), indium tin oxide (ITO), indium zinc oxide (IZO), tin oxide, zinc oxide, zirconium-doped indium oxide, aluminum-doped indium oxide, titanium nitride, Ga—In—Sn—O, Zn—In—Sn—O, polystyrenesulfonic acid-doped polyaniline, poly(3,4-ethylenedioxythiophene), poly(thiophene-3-[2[(2-methoxyethoxy)ethoxy]-2,5-diyl) (also commercially known as PLEXCORE®) or the like, or a combination thereof.

The substrate is first optionally cleaned to remove any contaminants and to create or expose any reactive species such as hydroxyls, carboxyls, esters, amines, and the like. Examples of cleaning solutions that may be used are piranha solution, nitric acid, sulfuric acid, hydrochloric acid, hydrofluoric acid, and the like. Alternatively, the surface can be treated with a radio-frequency air plasma to clean it and to create or expose any reactive species present on the substrate.

The cleaned substrate is then functionalized with functional moieties 102 capable of undergoing atom transfer radical polymerization (ATRP) with monomers that preferably comprise a monofunctional ethylenically unsaturated moiety. In an embodiment, the substrate may be functionalized with silanes, phosphonic acids/phosphonates, alkenes, carboxylates, catechols, alkynes, amines, thiols, or the like, or a combination thereof.

In an exemplary embodiment, the substrate is first functionalized with oligomeric or polymeric moieties. Examples of oligomeric or polymeric moieties are alkenes having 2 to 40, preferably 3 to 12 carbon atoms. The surface may be functionalized using heat or light. In an embodiment, ultraviolet (UV) light is used to facilitate surface functionalization.

The use of UV light allows for patterning the surface. In an embodiment, the substrate may be spatially and temporally patterned in order to obtain lateral control. By using certain functional moieties, spatial control of the moiety placement can be obtained. Spatial control enables grouping the colors into pixels that ultimately can generate display images.

For example, using alkenes permits spatial positioning of the functional groups on the substrate. Temporal patterning via photo-masking is discussed in detail below. The benefit of temporal control is that multiple blocks with different compositions can be grown both within a single brush polymer and within different pixels. Spatial and temporal control is useful for display applications, since multiple colors can be generated on one substrate, as is the case for red-green-blue pixels in a display.

The functionalized substrate is then reacted with an ATRP initiator to form an ATRP initiator functionalized moiety 104. The substrate 100 with the ATRP initiator functionalized moiety 104 disposed thereon is termed the ATRP initiator functionalized substrate. In an embodiment, temporal control via photo-masking may be achieved during the reaction of the functional moiety with the ATRP initiator. A photomask is applied to the substrate and only on the exposed portion of the substrate is the functional moiety reacted with the ATRP initiator.

Examples of ATRP initiators include bis[2-(2'-bromoisobutyryloxy)ethyl]disulfide, 2-azidoethyl 2-bromoisobutyrate, bis[2-(2-bromoisobutyryloxy)undecyl] disulfide, 2-bromoisobutanoic acid N-hydroxysuccinimide ester, 2-bromoisobutyric anhydride, α-bromoisobutyryl bromide (BIBB), 2-(2-bromoisobutyryloxy)ethyl methacrylate, tert-butyl α-bromoisobutyrate, 3-butynyl 2-bromoisobutyrate, dipentaerythritol hexakis(2-bromoisobutyrate), dodecyl 2-bromoisobutyrate, ethyl α-bromoisobutyrate, ethylene bis(2-bromoisobutyrate), 2-hydroxyethyl 2-bromoisobutyrate, 1-(DL-1,2-isopropylideneglyceryl) 2-bromoisobutyrate, methyl α-bromoisobutyrate, octadecyl 2-bromoisobutyrate, pentaerythritol tetrakis(2-bromoisobutyrate), 1-(phthalimidomethyl) 2-bromoisobutyrate, propargyl 2-bromoisobutyrate, 1,1,1-tris(2-bromoisobutyryloxymethyl)ethane, 10-undecenyl 2-bromoisobutyrate, poly(ethylene glycol) bis(2-bromoisobutyrate) having a weight average molecular weight of 300 to 5000 grams per mole. An exemplary ATRP initiator is α-bromoisobutyryl bromide (BIBB).

The ATRP initiator functionalized substrate is then subjected to spatial (also called lateral) temporal patterning. Lateral patterning is patterning in the plane of the substrate, while spatial control is patterning that occurs perpendicular to the plane of the substrate. Spatial control may be obtained by using masks with different region sizes, different filters, or the like, while temporal control (also known as time dependent control) is obtained by varying the intensity or frequency of radiation, by varying the ratio and the chemistry of the monomers fed to the reactive substrate.

In an embodiment, lateral and temporal control may be accomplished by photomasking. Photomasking is conducted during the formation of the brush polymer or prior to the formation of the brush polymer. The use of a photomask permits the use of different ratios of the second electroactive moiety (e.g., the emitter) to the first electroactive moiety (e.g., the host) in different regions of the substrate during polymerization thus producing brush polymers with different stoichiometric ratios of emitter to host in the different regions. The different ratios of the emitter to host in the polymer brush are achieved by using differing amounts of the first and second ethylenically unsaturated monomers in different regions. For example, a first region on the substrate has disposed on it a first ratio of the first ethylenically unsaturated monomer to that of the second ethylenically unsaturated monomer. The first region is exposed to visible light (while all other regions are masked during the exposure) so that the ethylenically unsaturated monomers undergo polymerization. The regions that are covered by the photomask are not affected by the exposure to light during the polymerization. A second region having a second ratio (different from the first ratio) of the first ethylenically unsaturated monomer to that of the second ethylenically unsaturated monomer is then exposed to light while all other regions of the substrate are masked. The ethylenically unsaturated monomers in the second region undergo polymerization. The first ethylenically unsaturated monomer that comprises the host undergoes polymerization to form the first block polymer, while the second ethylenically unsaturated monomer that contains the emitter undergoes polymerization to form the second block polymer. The different regions (having differing ratios of host to emitter) emit light of different wavelengths when activated.

In an embodiment, different host and emitter moieties can be used in each region. By varying the chemistry of the host and emitter moieties, the light emitted in different regions of the substrate may be of different wavelengths. It is also to be noted that a substrate washing step with a solvent is preferred between successive polymerization steps. In an embodiment, the polymeric endgroups (e.g., halogens such as bromine) may be removed using a photochemical reaction with spatial specificity at any point during the polymerization process (detailed above) or non-selectively after the last polymerization is done using a chemical reaction.

The first region, the second region and the third regions can have areas with various cross-sectional geometries when viewed from the top. The cross-sectional areas can be square, rectangular, circular, triangular, polygonal, or a combination thereof. The first region, the second region, the third region, and so on can be periodically arranged or aperiodically arranged. In an embodiment, an average periodicity between the first region and the second region, between the second region and the third region or between the second region and the third region may be 10 nanometers or larger, preferably 20 nanometers to 10 micrometers, and more preferably 250 nanometers to 5 micrometers.

In another embodiment, surface grown polymer brush heights can be from 5 to 800 nm, more preferably from 10 to 600 nm.

The monofunctional ethylenically unsaturated moieties have a host and emitter functional groups bonded thereto. In an embodiment, the monofunctional ethylenically unsaturated moiety may comprise vinyl aromatic monomers, acrylates, methacrylates, vinyl ethers, maleates, fumarates, acrylamides, styrenics, cyanoacrylates, or the like, or a combination thereof.

The host is a pendent group (and can be viewed as a first graft) that is covalently or ionically bonded to the chain backbone of the first block polymer. The emitter is also a pendent group (and can be viewed as a second graft) that is covalently or ionically bonded to the chain backbone of the second block polymer. The first block polymer and the second block polymer are covalently bonded to each other to form a random or block copolymer (which is also referred to herein as the brush polymer).

It is generally desirable for the first excited triplet state (T1) of the host to be preferably higher than the first excited triplet state of the emitter. In a fluorescent system, the first excited singlet state of the host is normally higher than the first excited singlet state of the emitter. Emitter-host systems where the emitter emitters have a relatively short wavelength, such as in the blue region (shorter than 500 nm) meet the aforementioned criteria. As used herein, a "phosphorescent system" is an emissive system in which most of the emission intensity is due to transitions from a triplet state, and does not entirely exclude some fluorescent emission. A "fluorescent system" is an emissive system in which most of the intensity is due to transitions from a singlet state. A thermally activated delayed fluorescent system (TADF) is an emissive system where a portion of excitons in the excited triplet state of the emitter may undergo thermal reverse intersystem crossing to the singlet excited state prior to emission. Particularly preferred emitter-host systems include emitters having phosphorescent or TADF emission, and a host with sufficiently high excited triplet state (T1) to permit emission predominantly from the emitter, at the characteristic emission wavelength of the emitter.

In an embodiment, the first ethylenically unsaturated monomers contain electroactive groups including carbazoles and other heterocyclic groups, while the second ethylenically unsaturated monomers contain emitter compounds that include fluorescent emitters (defined as fluorescent system above), phosphorescent emitter containing iridium and thermally activated delayed fluorescence (TADF) emitters.

Examples of emitters are a substituted or unsubstituted sulfonyl compound, a substituted or unsubstituted carbazole compound, a substituted or unsubstituted triazole compound, a substituted or unsubstituted acridine compound, a substituted or unsubstituted triazine compound, a substituted or unsubstituted nitrile compound, a substituted or unsubstituted phenylpyridine compound, a substituted or unsubstituted phenoxazine compound, a substituted or unsubstituted fluorene compound, a substituted or unsubstituted oxadiazole compound, a substituted or unsubstituted xanthene compound, a substituted or unsubstituted phenylamino compound, a substituted or unsubstituted phenazine compound, a substituted or unsubstituted arylboron-containing compound, an organocopper compound, an organoplatinum compound, an organoiridium compound, an organopalladium compound, or a combination thereof.

The host moiety is a substituted or unsubstituted carbazole compound, a substituted or unsubstituted triazole compound, a substituted or unsubstituted acridine compound, a substituted or unsubstituted triazine compound, substituted or unsubstituted pyridine compound, a substituted or unsubstituted phenoxazine compound, a substituted or unsubstituted fluorene compound, substituted or unsubstituted phosphine-oxide, substituted or unsubstituted tetra-phenyl-silane, substituted or unsubstituted quinazoline, substituted or unsubstituted Be-complexes, substituted or unsubstituted oxadiazole, substituted or unsubstituted biphenyls, substituted or unsubstituted dibenzo furan, substituted or unsubstituted 1,3,5,2,4,6-triazatriphosphinine, substituted or unsubstituted dibenzocarbazole, substituted or unsubstituted anthracene, substituted or unsubstituted naphthalene, substituted or unsubstituted phenanthrene, substituted or unsubstituted triphenylene, substituted or unsubstituted imidazole, substituted or unsubstituted benzimidazole, substituted or unsubstituted phenanthroline, substituted or unsubstituted spirofluorenes, substituted or unsubstituted silane or a combination thereof.

The HTL moiety is a substituted or unsubstituted triarylamine, substituted or unsubstituted carbazole compound, a substituted or unsubstituted acridine compound, a substituted or unsubstituted phenoxazine compound, a substituted or unsubstituted fluorene compound, substituted or unsubstituted tetra-phenyl-silane, substituted or unsubstituted biphenyls, substituted or unsubstituted dibenzo furan, substituted or unsubstituted dibenzocarbazole, substituted or unsubstituted anthracene, substituted or unsubstituted naphthalene, substituted or unsubstituted phenanthrene, substituted or unsubstituted triphenylene, substituted or unsubstituted spirofluorenes, substituted or unsubstituted silane or a combination thereof.

The ETL moiety is a substituted or unsubstituted carbazole compound, a substituted or unsubstituted triazole compound, a substituted or unsubstituted triazine compound, substituted or unsubstituted pyridine compound, a substituted or unsubstituted fluorene compound, substituted or unsubstituted phosphine-oxide, substituted or unsubstituted tetra-phenyl-silane, substituted or unsubstituted quinazoline, substituted or unsubstituted Al-complexes, substituted or unsubstituted Li-complexes, substituted or unsubstituted oxadiazole, substituted or unsubstituted biphenyls, substituted or unsubstituted 1,3,5,2,4,6-triazatriphosphinine, substituted or unsubstituted dibenzocarbazole, substituted or unsubstituted anthracene, substituted or unsubstituted naphthalene, substituted or unsubstituted imidazole, substituted or unsubstituted benzimidazole, substituted or unsubstituted phenanthrene, substituted or unsubstituted triphenylene, substituted or unsubstituted phenanthroline, substituted or unsubstituted spirofluorenes, substituted or unsubstituted silane or a combination thereof.

The HIL moiety is a substituted or unsubstituted triarylamine, substituted or unsubstituted carbazole compound, a substituted or unsubstituted acridine compound, a substituted or unsubstituted phenoxazine compound, a substituted or unsubstituted fluorene compound, substituted or unsubstituted tetra-phenyl-silane, substituted or unsubstituted biphenyls, substituted or unsubstituted dibenzo furan, substituted or unsubstituted dibenzocarbazole, substituted or unsubstituted anthracene, substituted or unsubstituted naphthalene, substituted or unsubstituted phenanthrene, substituted or unsubstituted triphenylene, substituted or unsubstituted spirofluorenes, substituted or unsubstituted silane, substituted or unsubstituted quinoxaline, substituted or unsubstituted aryl-florides, substituted or unsubstituted thiophenes, substituted or unsubstituted aryl-sulphonates or a combination thereof.

Particularly preferred are carbazole, phenoxazine, hydroacridine and fluorene derivatives that also contain N-heterocycles including triazine, quinazolines, pyridines and pyrimidine. These compounds have a sufficiently large band gap, as well as sufficiently high Ti and Si energy states to allow emission from the emitter that emit well into the blue spectrum. They also tend to be less inclined to crystallize, offering the additional benefit of a more robust morphology.

A suitable carbazole derivative that can be used (as the first, third and fifth electroactive moieties) for forming the first block of the brush polymer is given by the formula (1)

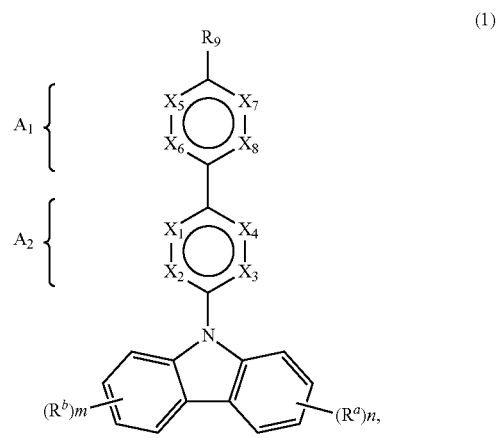

(1)

where at least one or more of $X_1$, $X_2$, $X_3$, $X_4$, $X_5$, $X_6$, $X_7$ and $X_8$ can independently be a nitrogen atom or a C(R) functionality, where R is selected from a hydrogen atom, an ethylenically unsaturated moiety, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_6$-$C_{60}$ heteroaryl group. In an embodiment, $X_1$ and $X_6$ and/or $X_4$ and $X_8$ may be a bonded to form a fused aromatic ring with $A_1$ and $A_2$.

In the formula (1), $R^a$ and $R^b$ are the same or different and are independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_6$-$C_{60}$ heteroaryl group. In the formula (1), m and n are independently 1 to 4 and can also assume values of 2 or 3. $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety is either a vinyl, norbornyl, an acrylate, a methacrylate, a styrene, an acrylamide, or a methacrylamide.

In one embodiment, in the formula (1), X1 and/or X4 are nitrogen atoms, while the remaining moieties $X_2$, $X_3$, $X_5$, $X_6$, $X_7$ and $X_8$ are C(R) functionalities, where R is a hydrogen atom. $R^a$ and $R^b$ are hydrogen atoms, with n and m both being equal to 1. $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety is either a vinyl, an acrylate, a methacrylate, a styrene, an acrylamide, or a methacrylamide.

In another embodiment, in the formula (1), $X_1$, $X_2$, $X_3$, and $X_4$ are all C(R) functionalities, where R is a hydrogen atom. At least one and preferably two of $X_5$, $X_6$, $X_7$ and $X_8$ are nitrogen atoms, with the remainder being C(R) functionalities, where R is a hydrogen atom. $R^a$ and $R^b$ are hydrogen atoms, with n and m both being equal to 1. $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety is either a vinyl, an acrylate, a methacrylate, a styrene, an acrylamide, or a methacrylamide.

In a preferred embodiment, in the formula (1), $X_6$ and $X_8$ are nitrogen atoms, while the remainder of $X_1$, $X_2$, $X_3$, $X_4$, $X_5$ and $X_7$ are all C(R) functionalities, where R is a hydrogen atom. $R^a$ and $R^b$ are hydrogen atoms, with n and m both being equal to 1. $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety is either a vinyl, an acrylate, a methacrylate, a styrene, an acrylamide, or a methacrylamide.

In yet another embodiment, in the formula (1), all of $X_2$, $X_3$, $X_5$, and $X_7$ are C(R) functionalities, where R is a hydrogen atom, while at least one of $X_1$ and $X_6$ or $X_4$ and $X_8$ are bonded together to form a substituted 5 or 6 membered ring. $R^a$ and $R^b$ are hydrogen atoms, with n and m both being equal to 1. $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety may be a vinyl, an acrylate, a methacrylate, a styrene, an acrylamide, or a methacrylamide.

In an embodiment, R9 may be one of the structures depicted in formulas (2), (3) and (4).

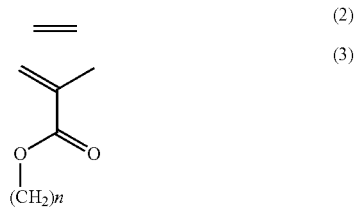

(2)

(3)

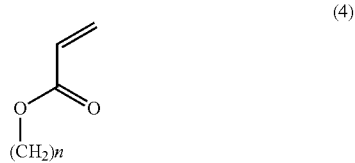

(4)

where n in the formulas (2) and (3) is 1 to 40, preferably 2 to 20.

In an embodiment, with reference to the formula (1), at least one of the aromatic rings $A_1$ and $A_2$ can be a substituted or unsubstituted phenyl, a substituted or unsubstituted pyridine, a substituted or unsubstituted pyridazine, a substituted or unsubstituted pyrimidine, a substituted or unsubstituted pyrazine, a substituted or unsubstituted 1,2,4-triazine, a substituted or unsubstituted 1,3,5-triazine, a substituted or unsubstituted 2H-thiopyran, a substituted or unsubstituted 2H-pyran, a substituted or unsubstituted 4H-pyran, a substituted or unsubstituted 1,4 dioxine, a substituted or unsubstituted 2H-thiopyran, a substituted or unsubstituted 4H-thiopyran, a substituted or unsubstituted 2H-1,2-oxazine, a substituted or unsubstituted 4H-1,2-oxazine, a substituted or unsubstituted 6H-1,2-oxazine, a substituted or unsubstituted 2H-1,3-oxazine, a substituted or unsubstituted 4H-1,3-oxazine, a substituted or unsubstituted 6H-1,3-oxazine, a substituted or unsubstituted 4H-1,4-oxazine, a substituted or unsubstituted 2H-1,2-thiazine, a substituted or unsubstituted 4H-1,4-thiazine, a substituted or unsubstituted 6H-1,2-thiazine, a substituted or unsubstituted 2H-1,4-thiazine, or the like. In an exemplary embodiment, the aromatic ring $A_2$ is benzene, while the ring $A_1$ is an unsubstituted pyrimidine.

Examples of carbazole derivatives that may be used as the first ethylenically unsaturated monomer include the structures of formulas (5)-(9):

(5)
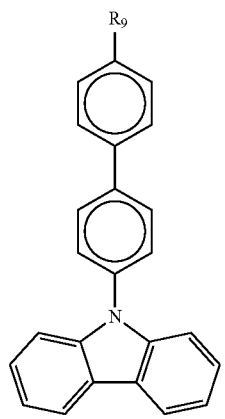

(6)
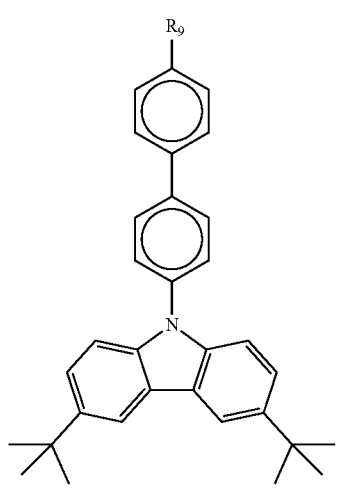

(7)
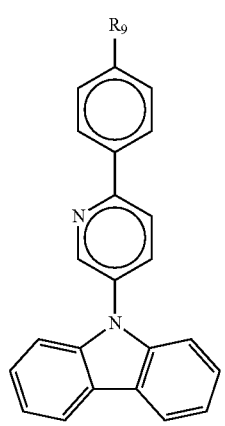

(8)
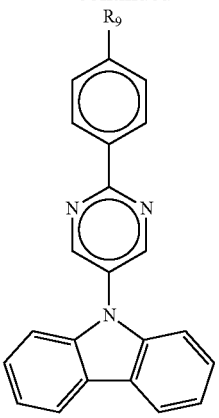

(9)
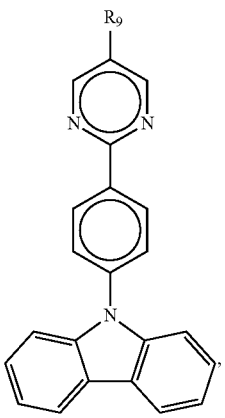

where $R^9$ comprises an ethylenically unsaturated moiety. In an embodiment, the ethylenically unsaturated moiety is bonded to the aryl group or the heteroaryl group via a $C_1$-$C_{30}$ alkyl or via a $C_3$-$C_{30}$ cycloalkyl. The ethylenically unsaturated moiety is either a vinyl, an acrylate, a methacrylate, a styrene, an acrylamide, or a methacrylamide.

A preferred carbazole derivative is that can be used for forming the first block of the brush polymer is 2-(2-(4-(9H-carbazol-9-yl)phenyl)pyrimidin-5-yl)ethyl methacrylate (M6MA) shown by the formula (10) below

(10)
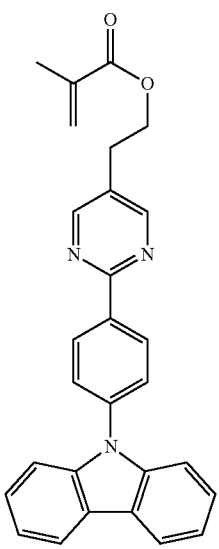

The second ethylenically unsaturated monomer may also serve as a photocatalyst for the polymerization reaction of the first ethylenically unsaturated monomer. Alternatively, a non-polymerizable photocatalyst may be used. The repeat units of the second ethylenically unsaturated monomer comprises a metal-complex shown in the formula (11). These metal complexes which are used in the second electroactive moiety, the fourth electroactive moiety and the sixth electroactive moiety are preferably emitter moieties and are described below in the formula (11).

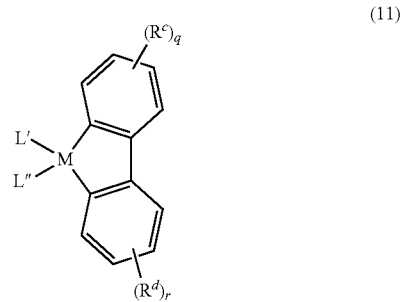

(11)

wherein, in the formula (11), M is iridium (Ir), osmium (Os), platinum (Pt), gold (Au), ruthenium (Ru), copper (Cu); and at least one of $R^c$ or $R^d$ is an ethylenically unsaturated moiety. The ethylenically unsaturated moiety may be covalently or ionically bonded to the carbazole moiety through a $C_1$-$C_{30}$ alkyl or via a $C_3$-$C_{30}$ cycloalkyl. The ethylenically unsaturated moiety may be a vinyl, an acrylate, a methacrylate, a styrene, an acrylamide, or a methacrylamide.

In an embodiment, one of $R^c$ or $R^d$ comprises an ethylenically unsaturated functionality, while the other functionality is independently selected from a hydrogen, a halogen atom, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{24}$ aryl group, a substituted or unsubstituted $C_6$-$C_{24}$ aryloxy group, a substituted or unsubstituted $C_6$-$C_{24}$ arylthio group, and a substituted or unsubstituted $C_6$-$C_{30}$ heteroaryl group.

In the formula (11), L' and L" are the same or different, and are each a bidentate ligand. In the formula (11), q and r are each independently an integer of 1 to 4.

In an embodiment, the second ethylenically unsaturated monomer is bis[[2-(X)]4-(pyridin-2-yl)oxymethylmethacrylate]-iridium(III) (referred to as iridium-X-methacrylate (IrXMA), where the X represents the C^N in the formula (12) below. The second ethylenically unsaturated monomer has the structure shown in the formulas (12) and (13) or (12) and (14):

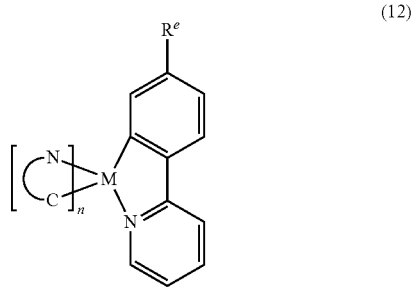

(12)

wherein in the formula (12), $R^e$ is a hydrogen atom, a cyano group, a halogen atom, a substituted or unsubstituted $C_1$-$C_{30}$ alkyl group, a substituted or unsubstituted $C_2$-$C_{10}$ alkenyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{24}$ aryl group, a substituted or unsubstituted $C_6$-$C_{24}$ aryloxy group, a substituted or unsubstituted $C_6$-$C_{24}$ arylthio group, and a substituted or unsubstituted $C_6$-$C_{30}$ heteroaryl group, and where C^N may be represented by the structure shown in the formula (13)

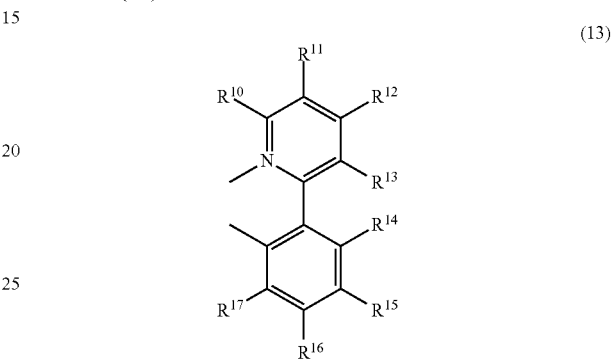

(13)

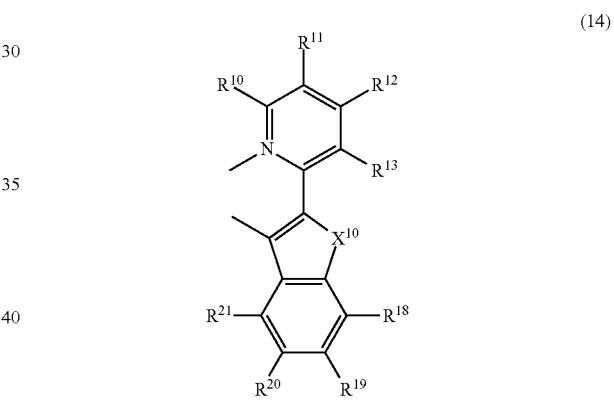

(14)

where $R^{10}$ to $R^{21}$ are each independently a hydrogen atom, a cyano group, a halogen atom, a substituted or unsubstituted $C_1$-$C_{30}$ alkyl group, a substituted or unsubstituted $C_2$-$C_{10}$ alkenyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{24}$ aryl group, a substituted or unsubstituted $C_6$-$C_{24}$ aryloxy group, a substituted or unsubstituted $C_6$-$C_{24}$ arylthio group, and a substituted or unsubstituted $C_6$-$C_{30}$ heteroaryl group; and where $X^{10}$ is oxygen or sulfur. In an embodiment, any of the adjacent groups of $R^{10}$ through $R^{21}$ may be fused together to form an aryl ring. "n" in the formula (12) can be 1 or 2. In an exemplary embodiment, M is Ir.

Examples of C^N (also referred to as $M_1$) (C^N refers to a ligand that coordinates through one carbon atom and one nitrogen atom to a metal center) are shown in the plurality of structures shown in the formulas (15a) through (15f), where structure (15a) below is difluorophenylpyridine (df-ppy):

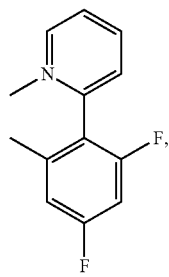

where structure (15b) below is phenylpyridine (ppy)

(15b)

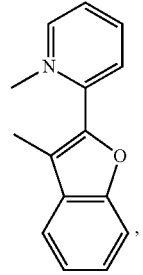

where structure (15d) is phenyl-isoquinoline (piq)

(15d)

where structure (15e) below is also phenylquinoline (pq)

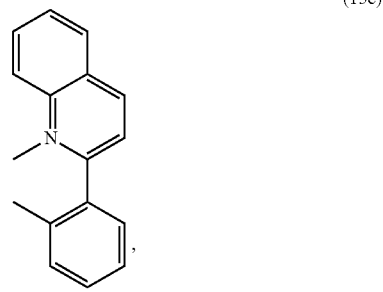

where structure (15f) below is benzothiophenylpyridine (btp)

Other emitters and/or electroactive materials that can be covalently bonded to the ethylenically unsaturated monomers include the structures shown below in formula (15g). The covalent bonding occurs through optional substitution of an ethylenically unsaturated group anywhere there is a C—H bond.

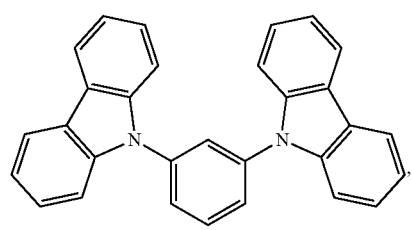

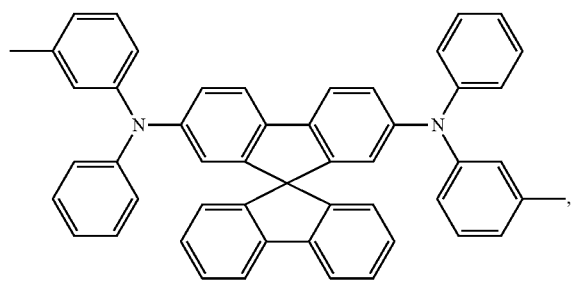

-continued
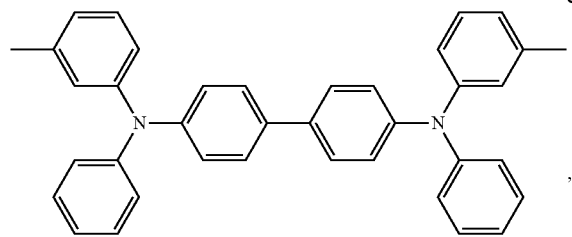
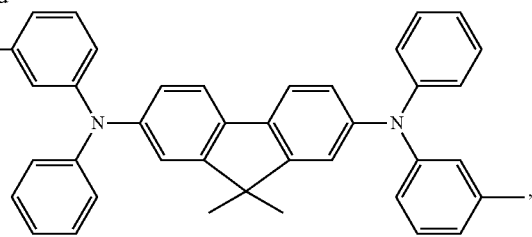
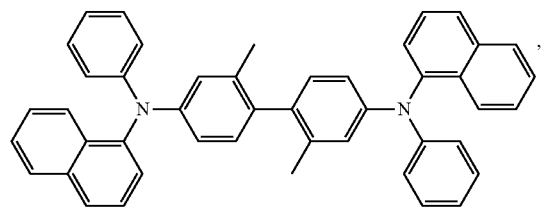
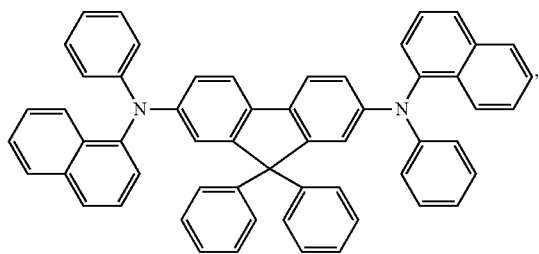
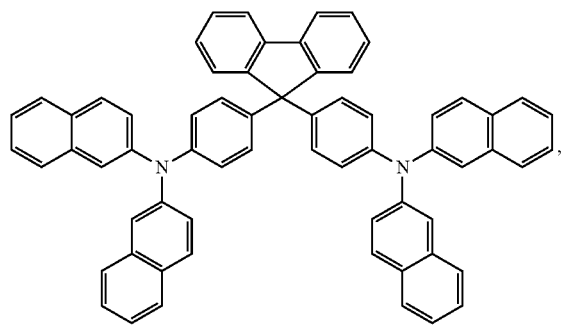
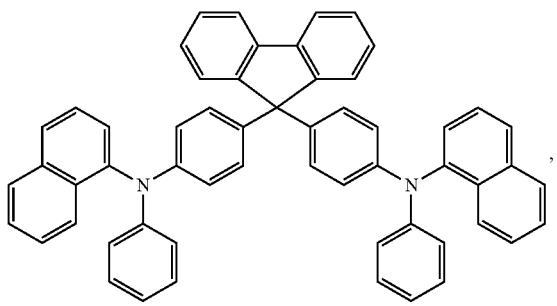
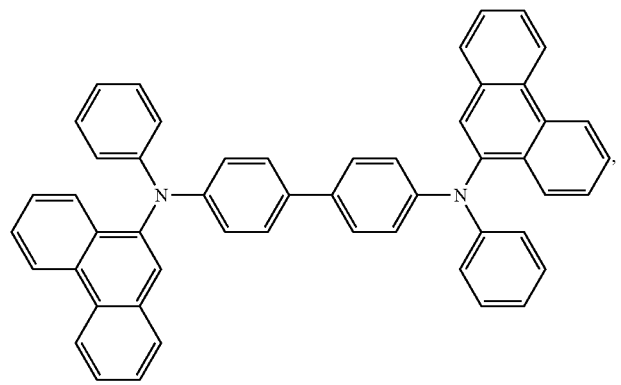
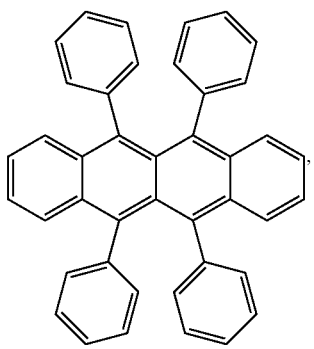
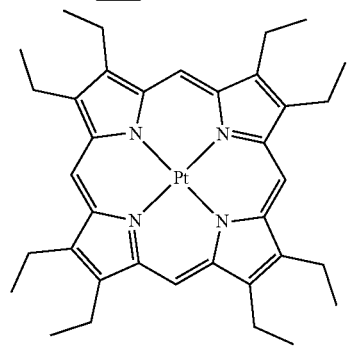
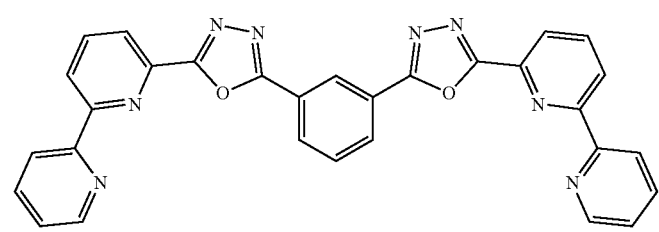

-continued
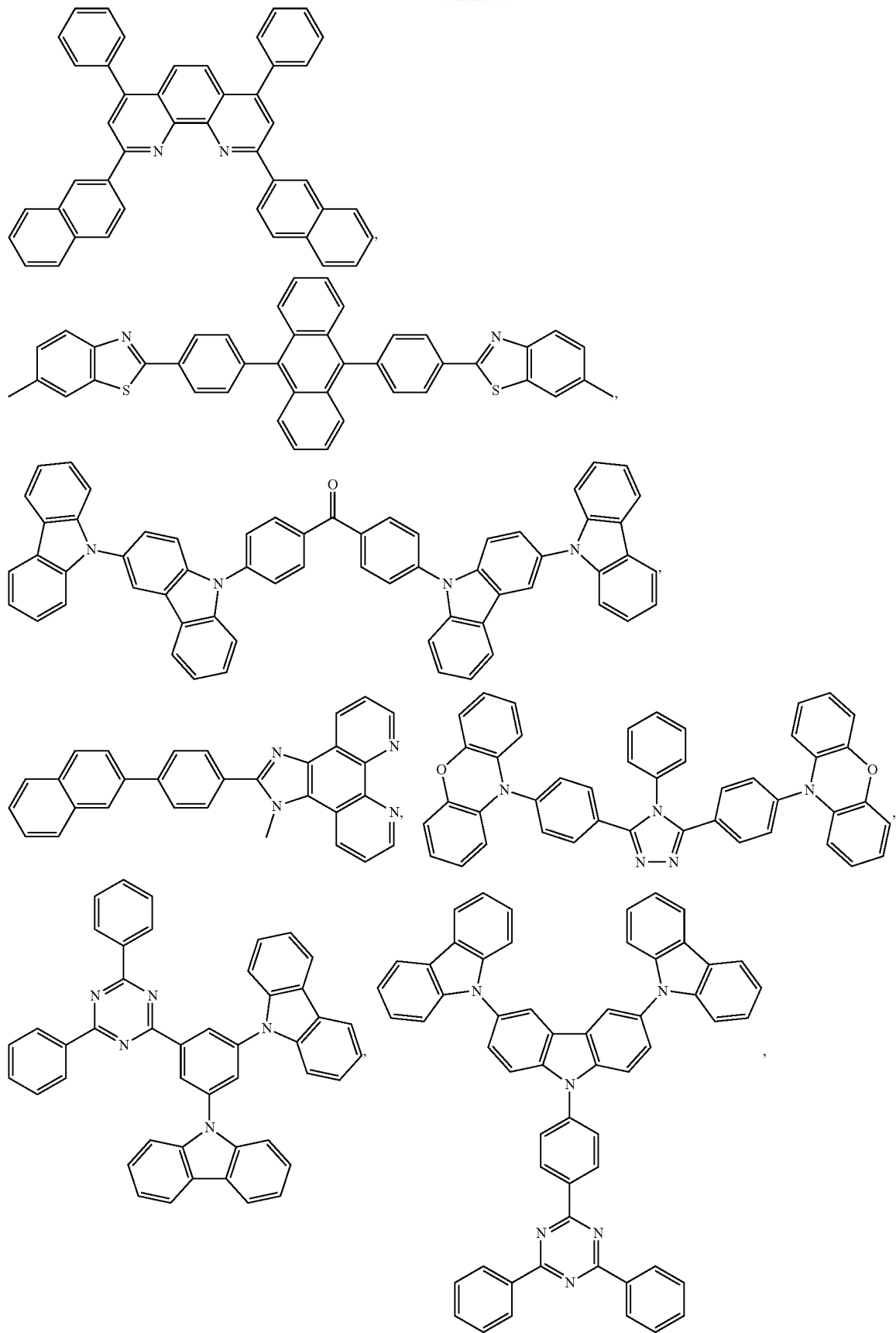

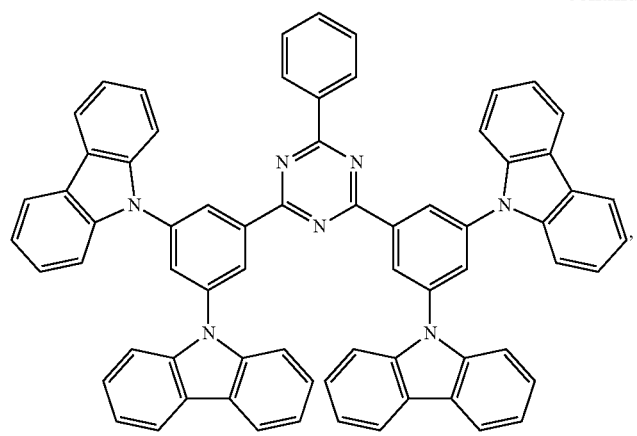
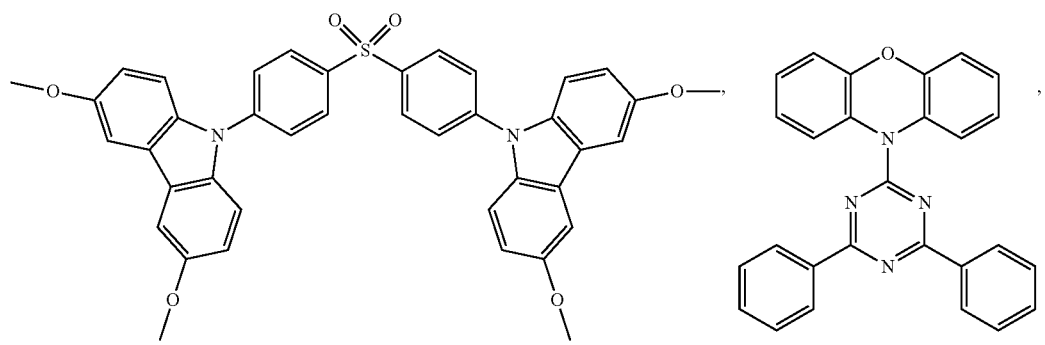
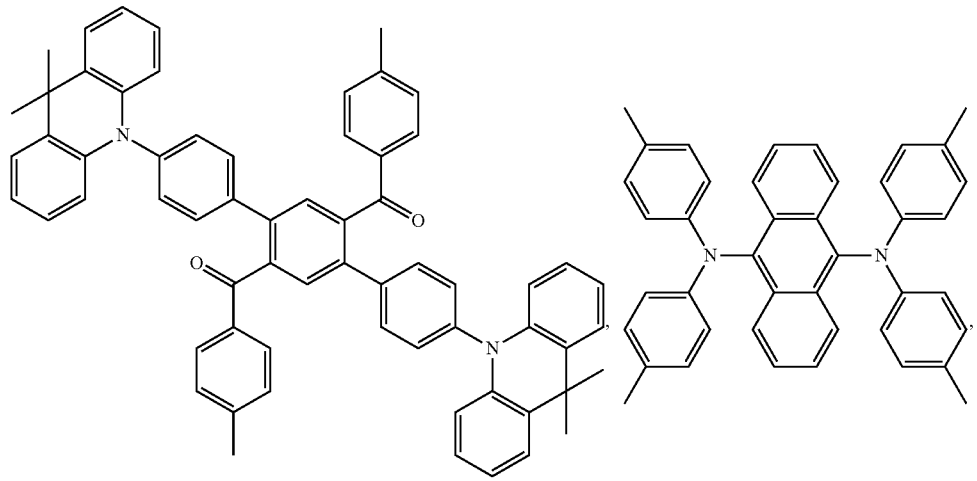
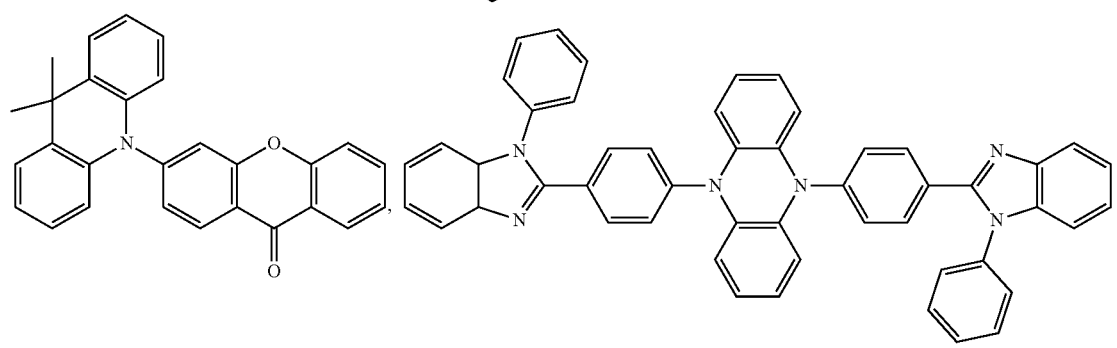

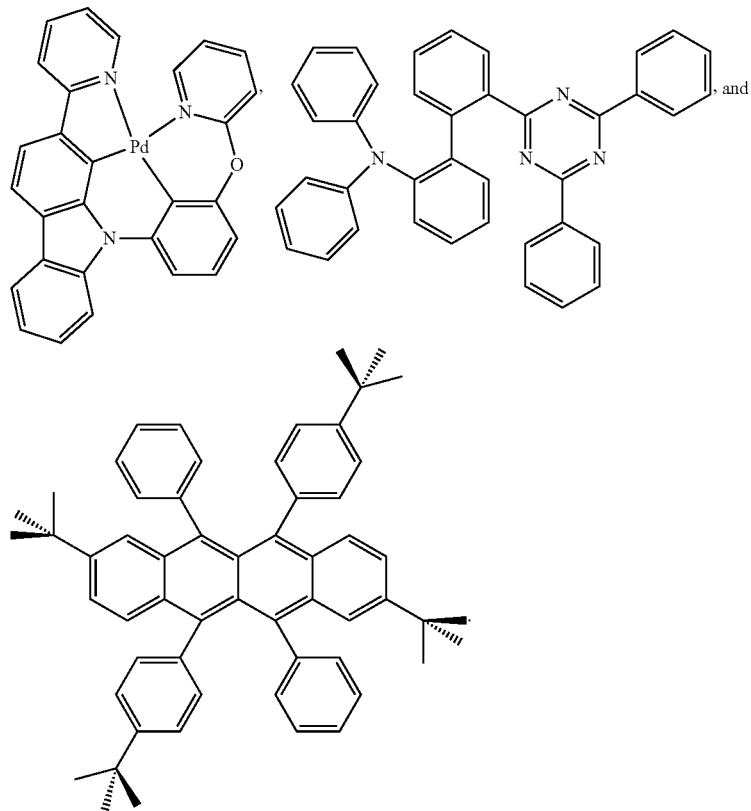
Other electroactive moieties emitters that may be covalently bonded to the ethylenically unsaturated moieties include the structures shown in the formula (15h) below. The covalent bonding occurs through optional substitution of an ethylenically unsaturated group anywhere there is a C—H bond.
(15h)
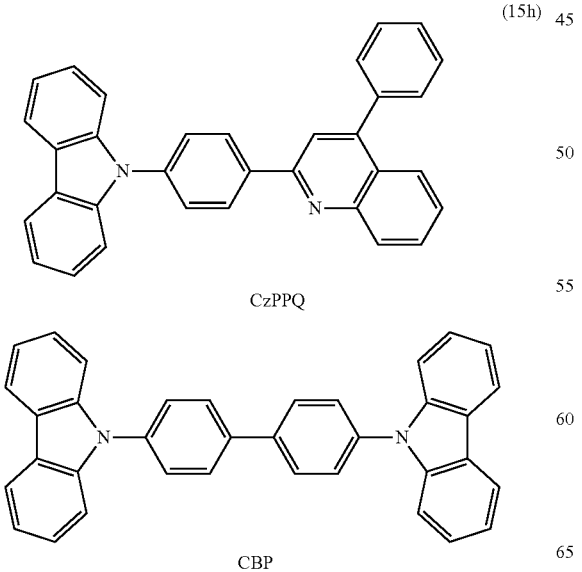
CzPPQ
CBP
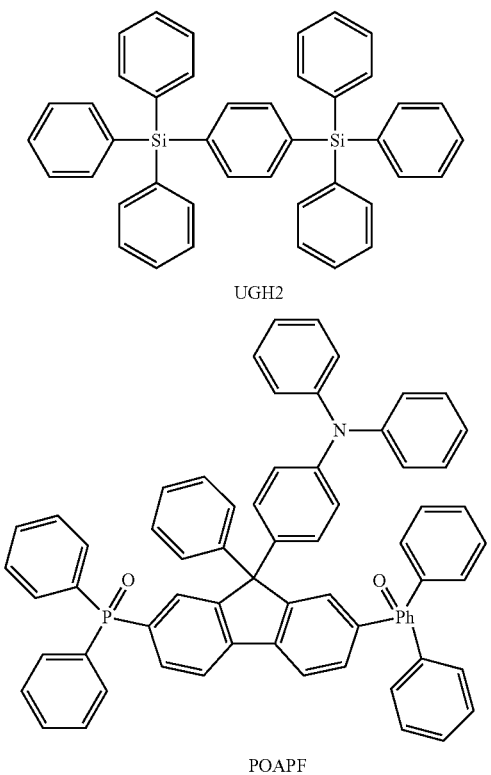
UGH2
POAPF

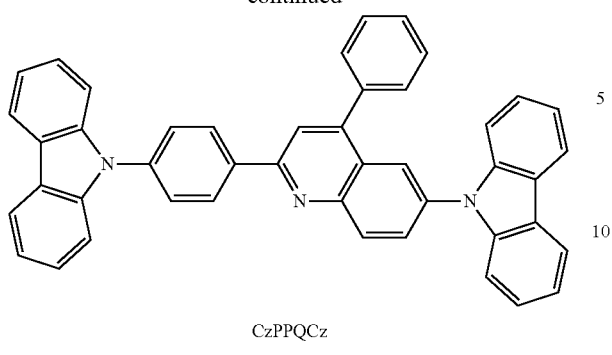
CzPPQCz
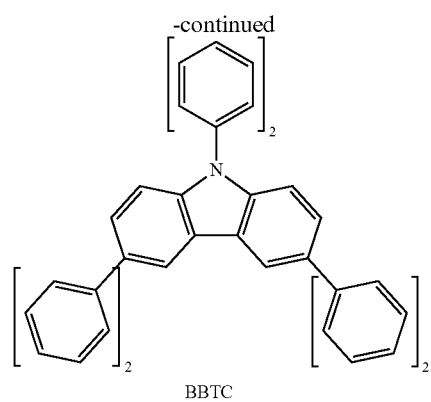
BBTC
TCTA
SitCz
UGH3
PO9
CzPhO
mCP

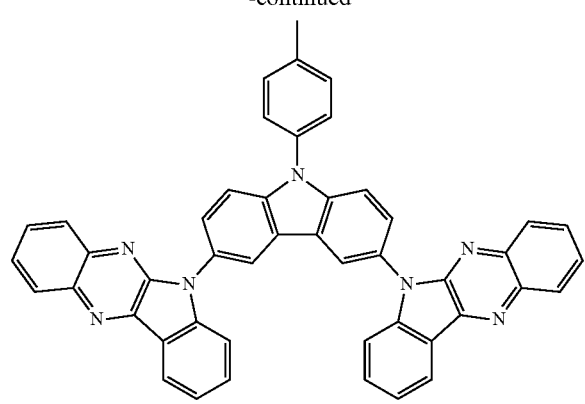
BIQMCz
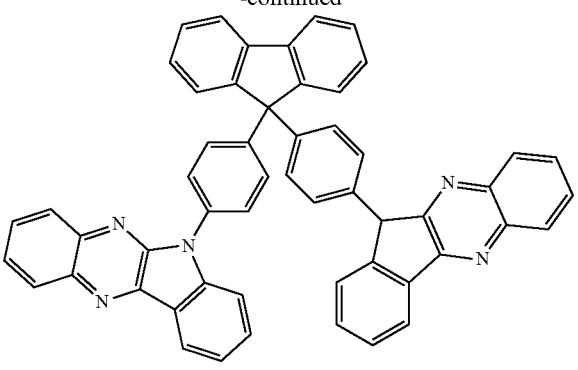
BIQF
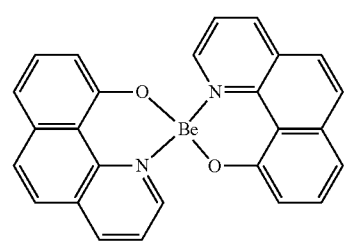
BeBq$_2$
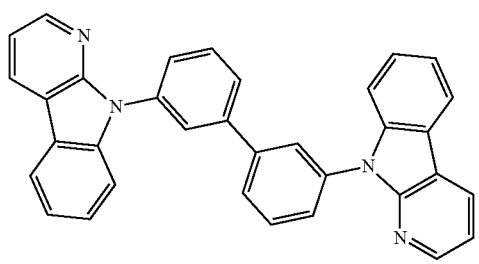
CbBPCb
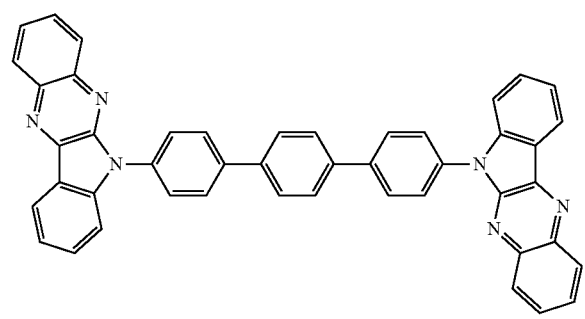
BIQT
PCMO
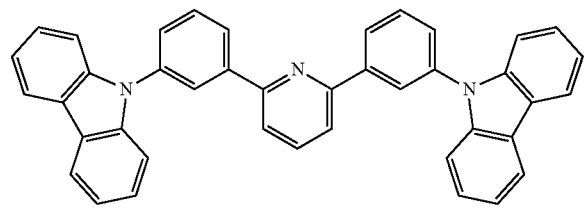
DCzPPy
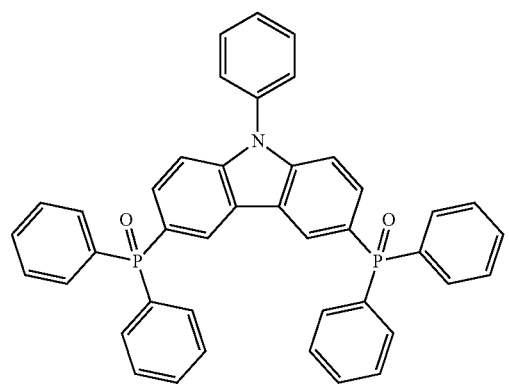
PPO2
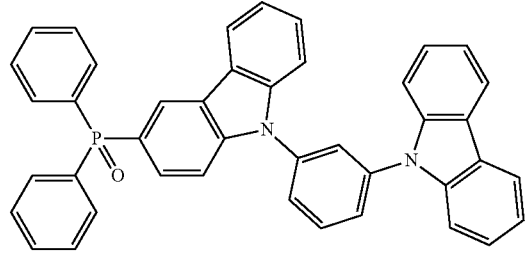
mCPPO1
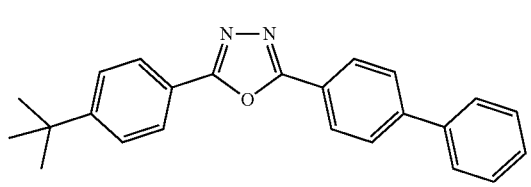
PBD -continued
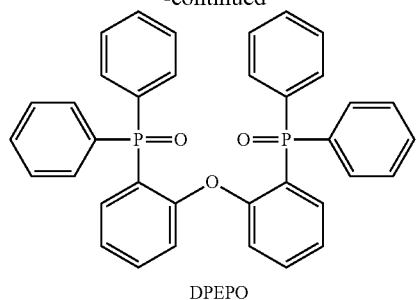
DPEPO
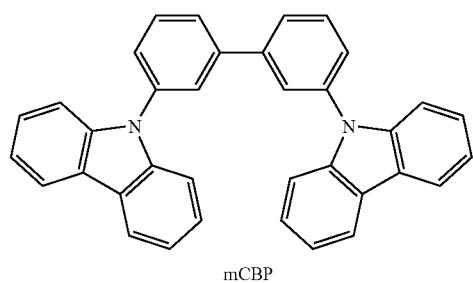
mCBP
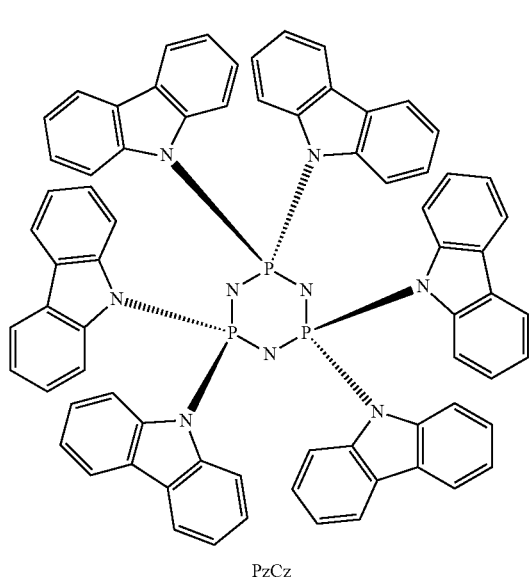
PzCz
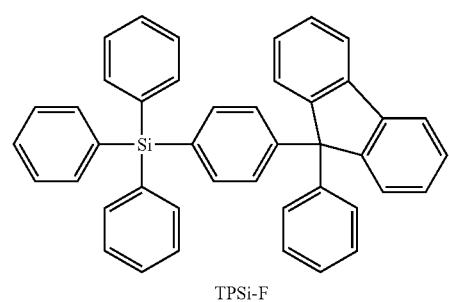
TPSi-F
-continued
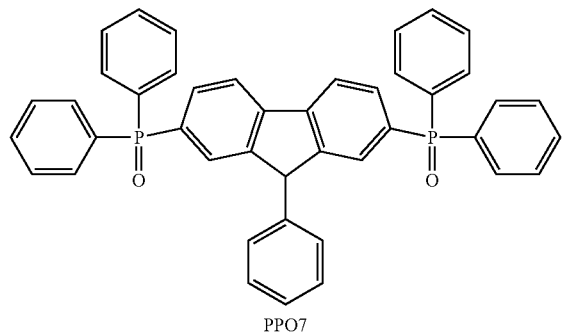
PPO7
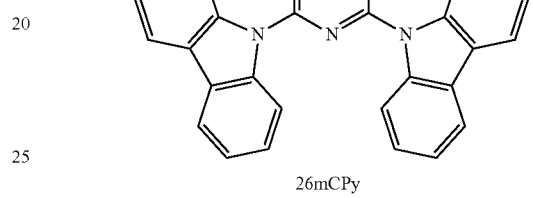
26mCPy
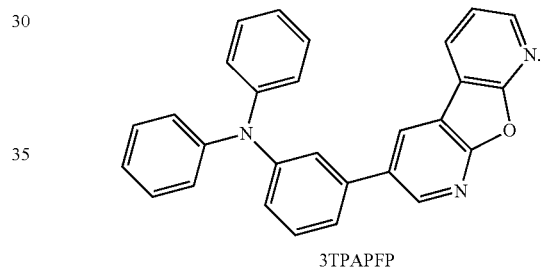
3TPAPFP
Examples of electroactive materials, which can be attached to polymer backbone are shown in the formula (15i)
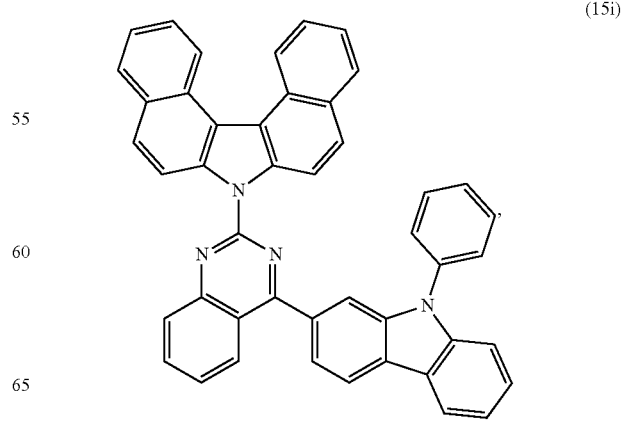
(15i)

-continued
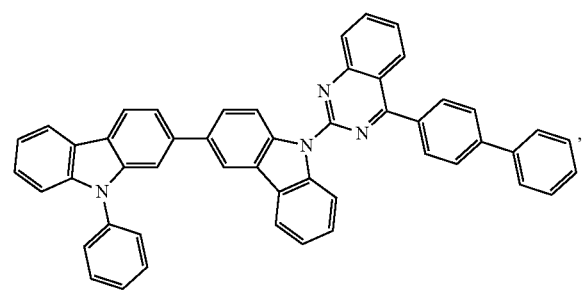
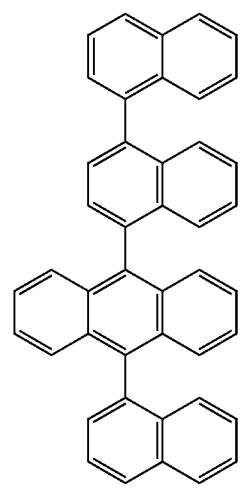
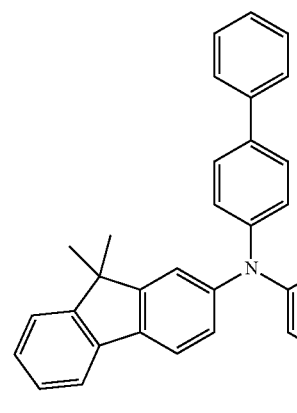
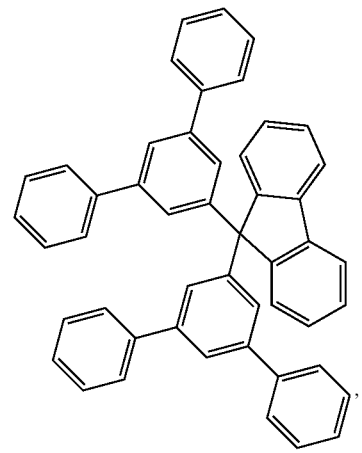
-continued
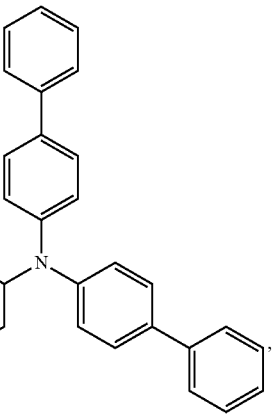
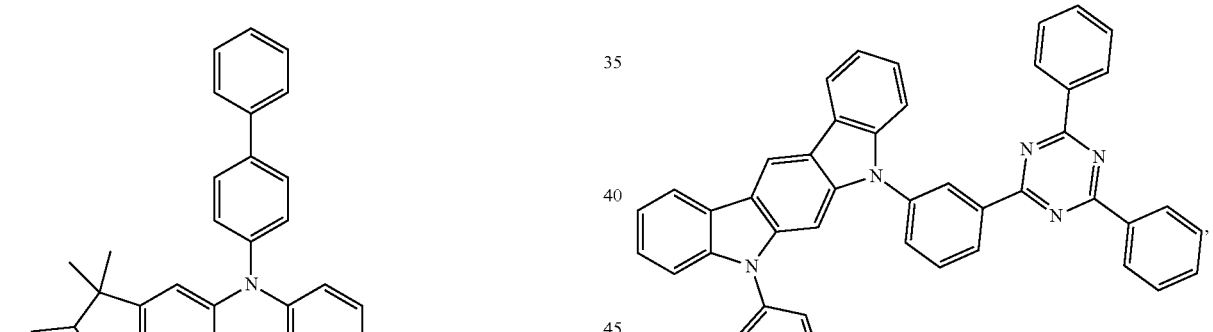
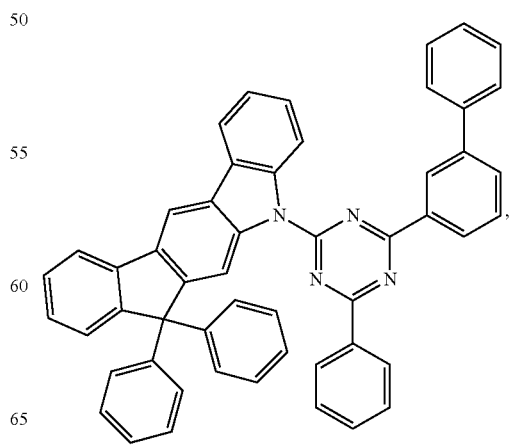

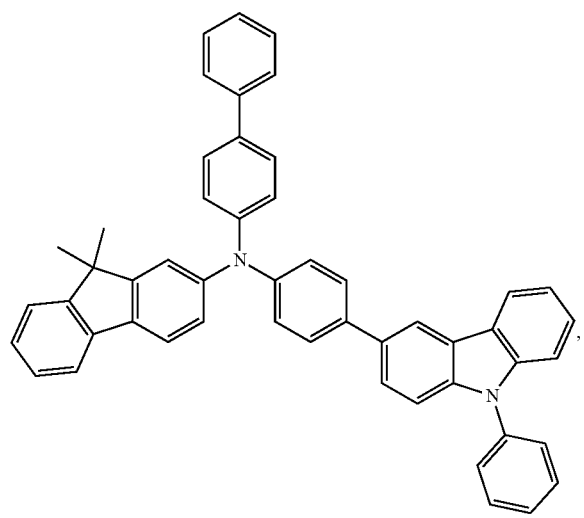
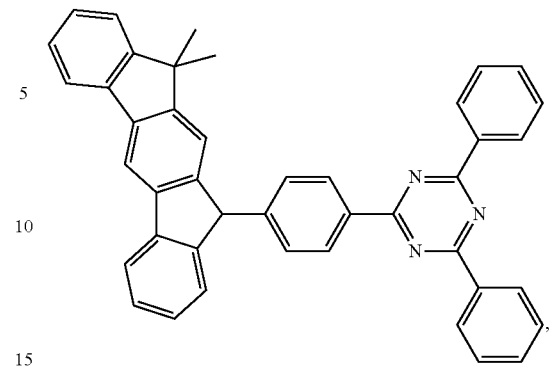
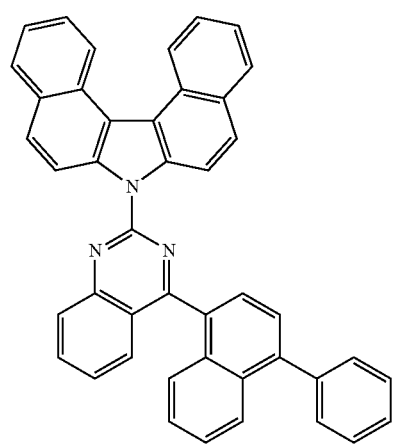
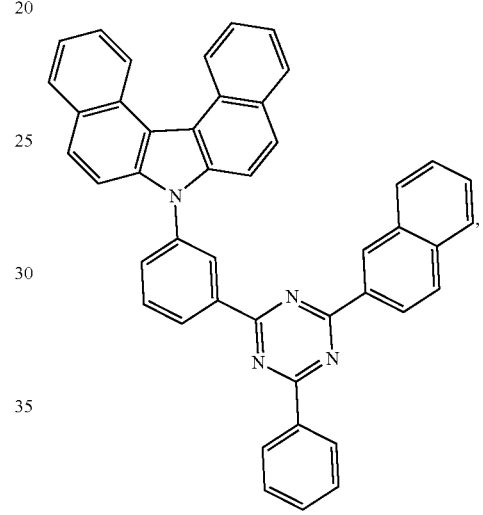
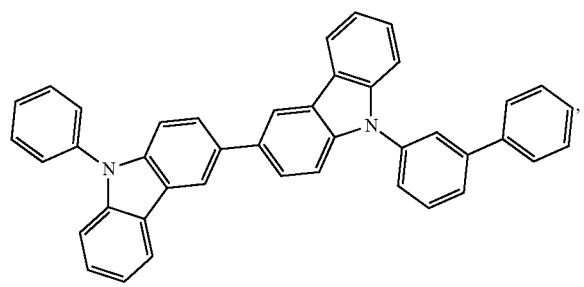
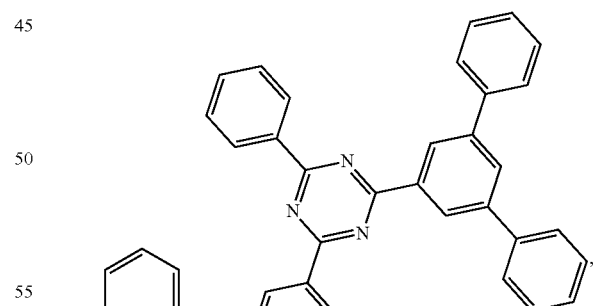
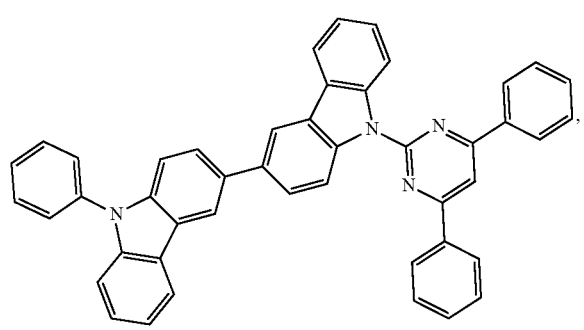
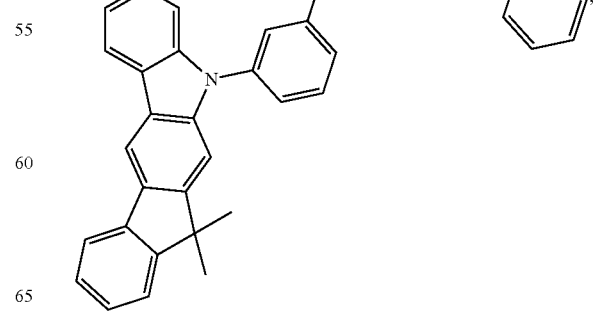

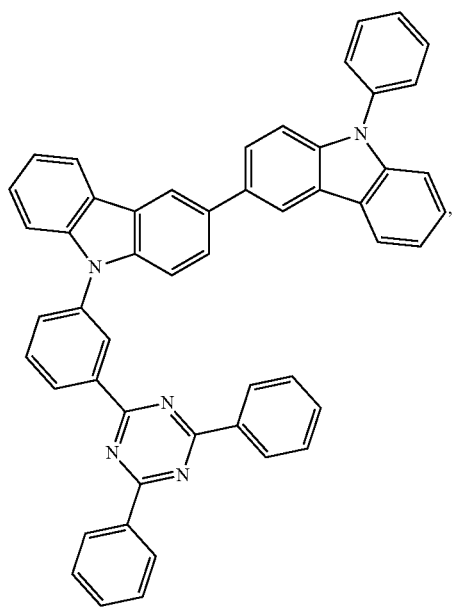
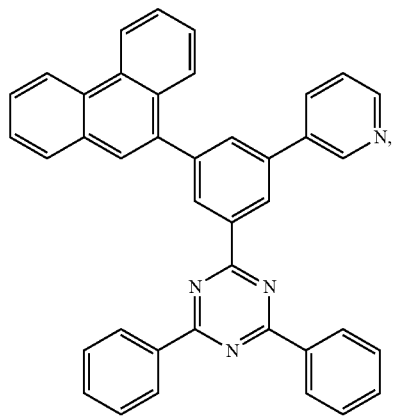
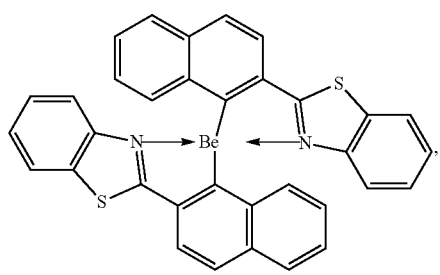
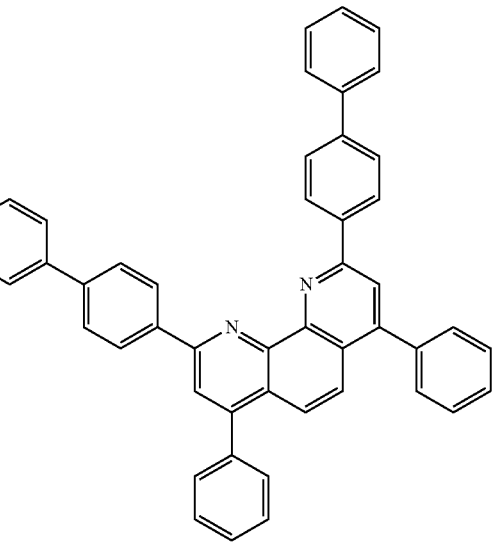
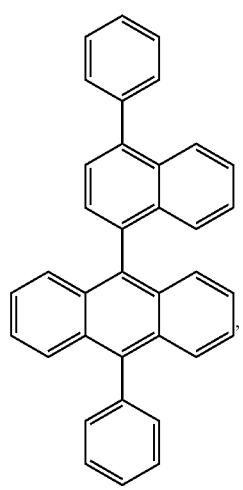
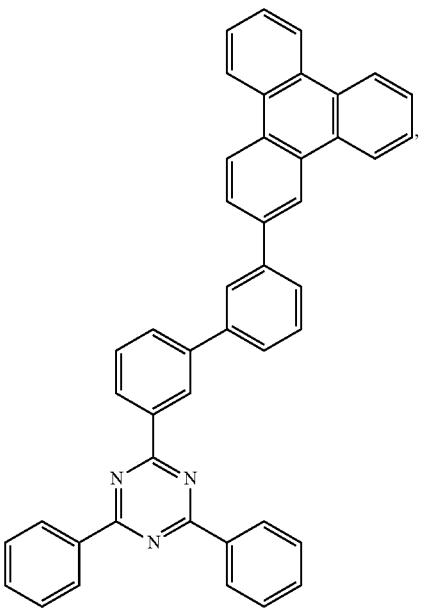

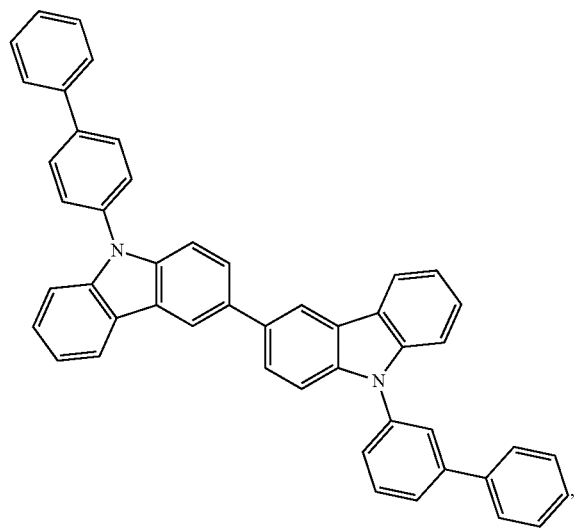
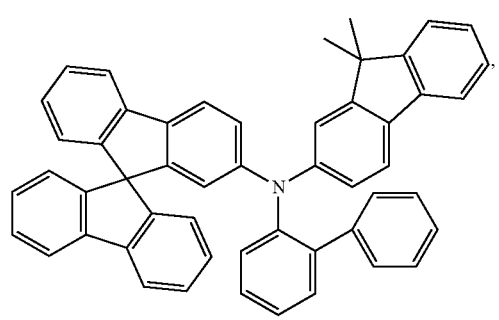
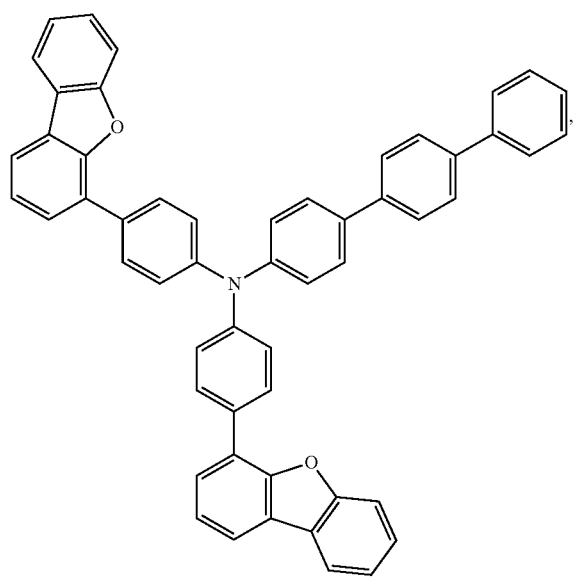
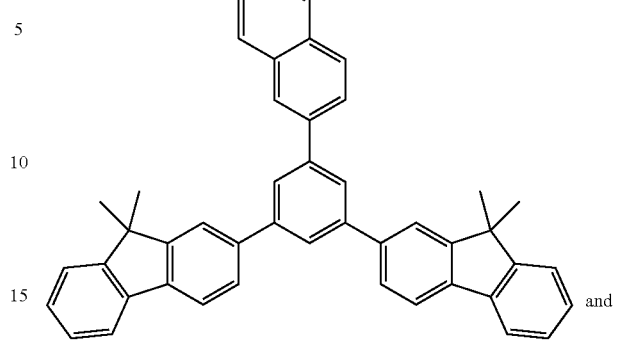
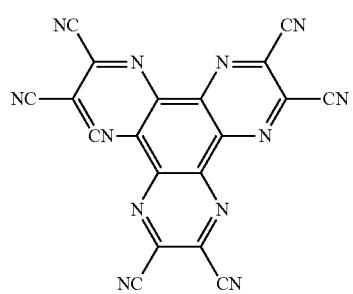
Examples of fluorescent and phosphorescent emitter molecules, which can be pendent to the polymer backbone are shown in the formula (15j) below
(15j)
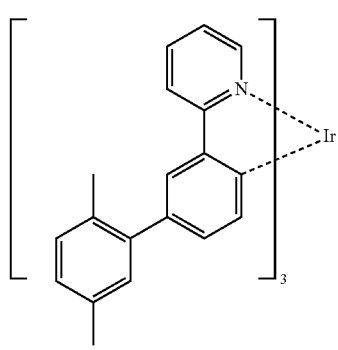
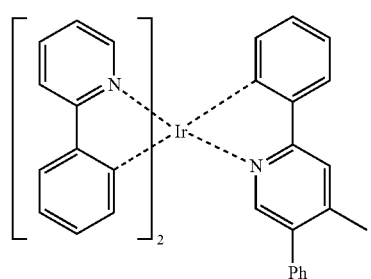

-continued
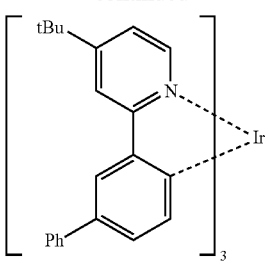
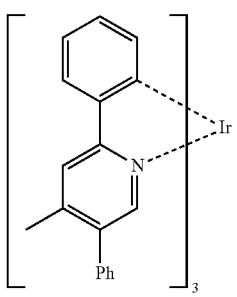
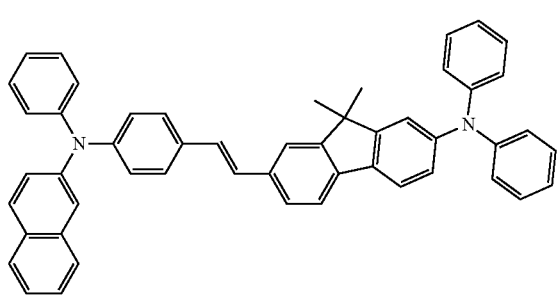
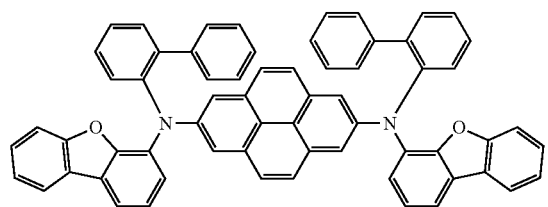
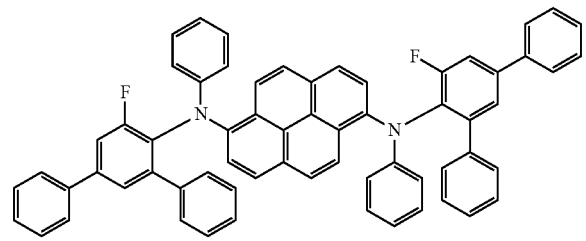
-continued
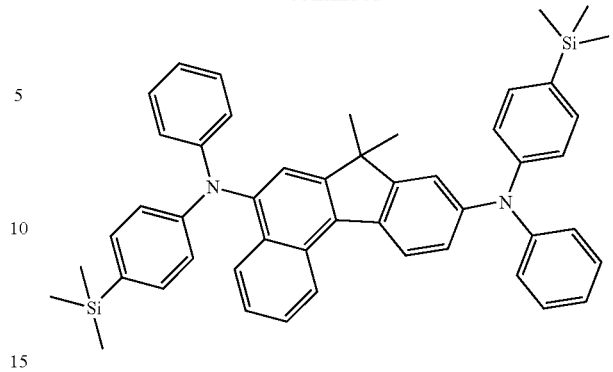
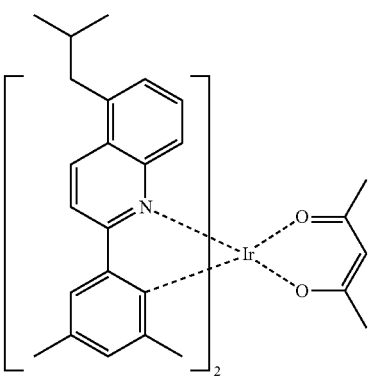
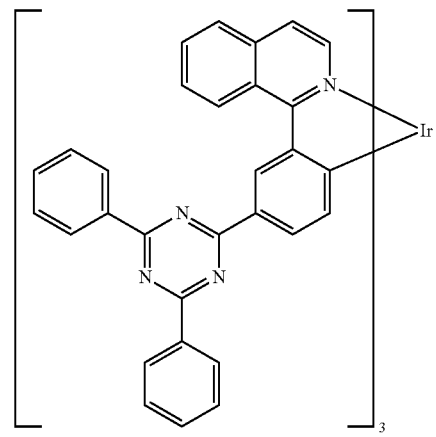
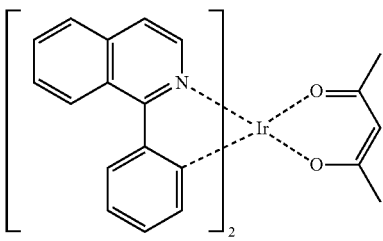
Examples of TADF emitter molecules, which can be attached to a polymer backbone are shown below in the formula (15k)

(15k)
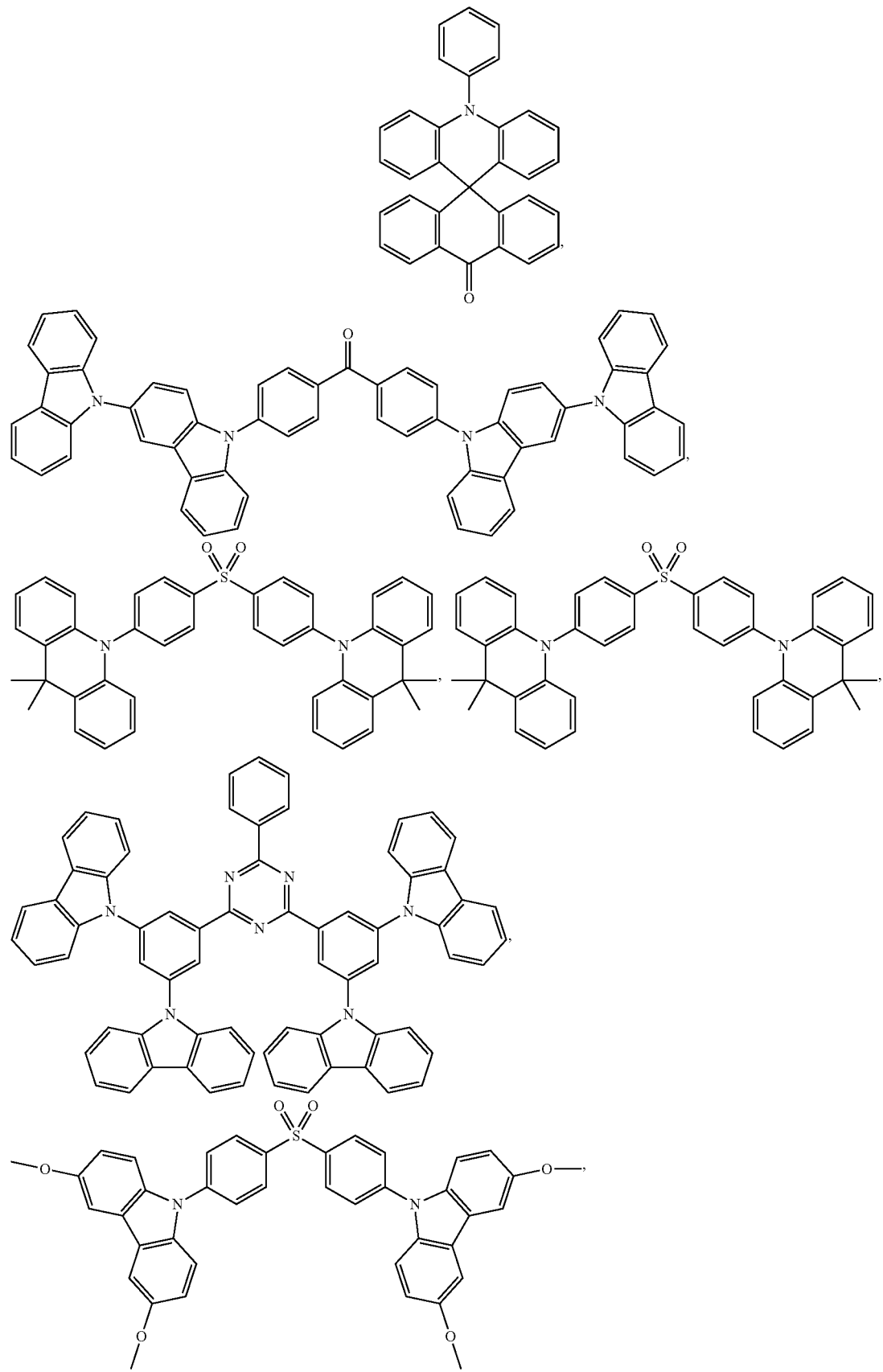

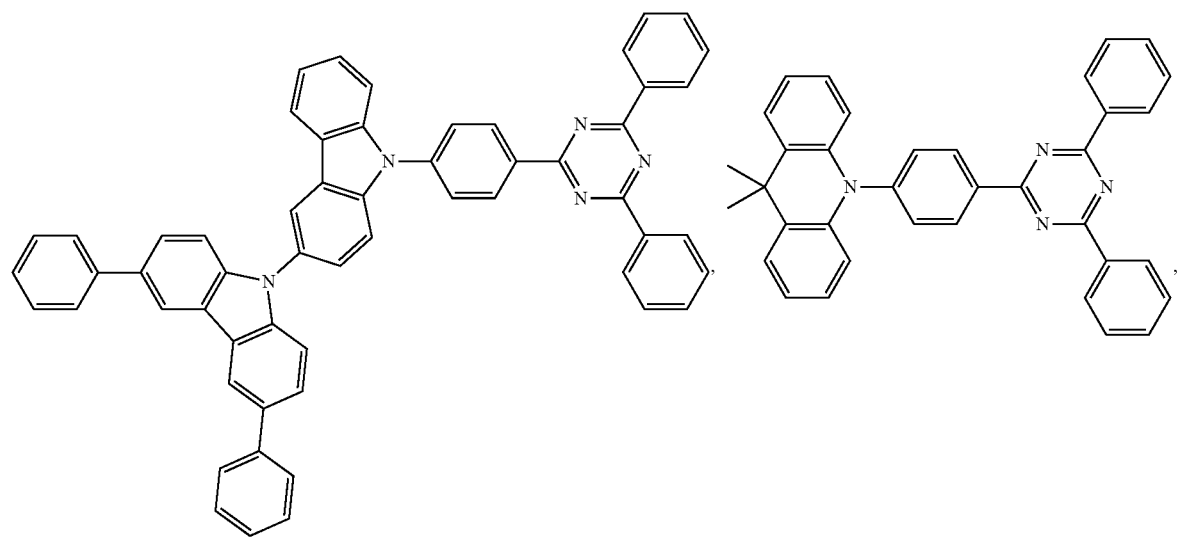

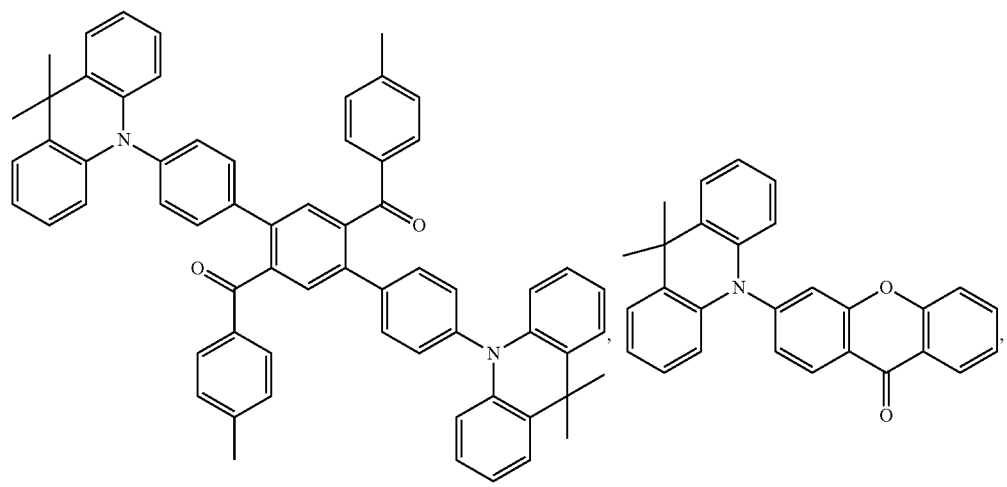
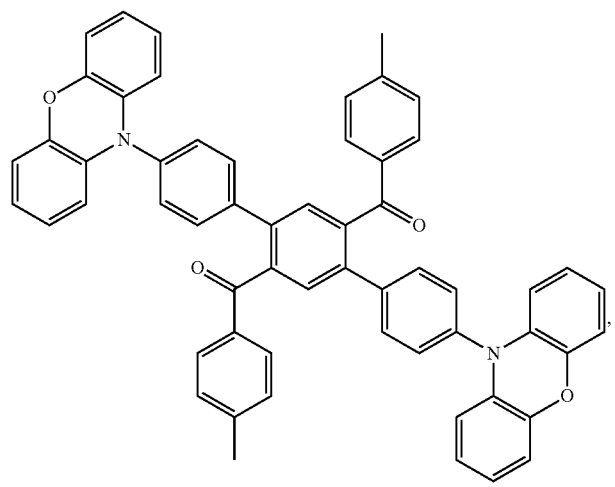
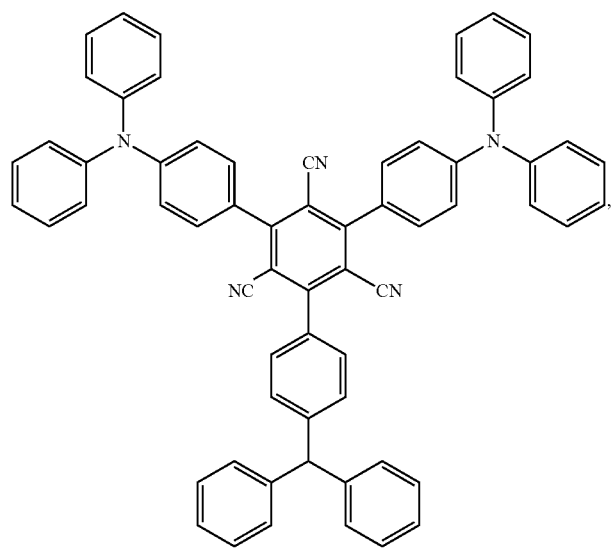

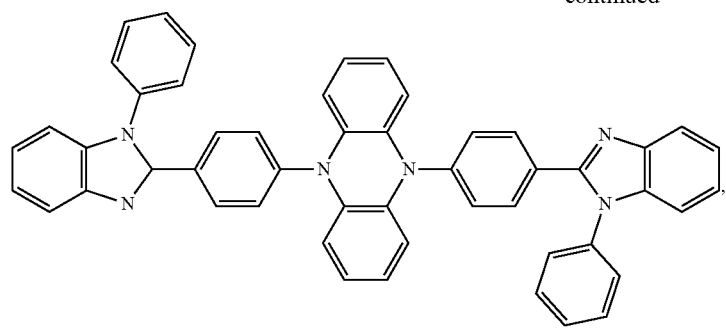
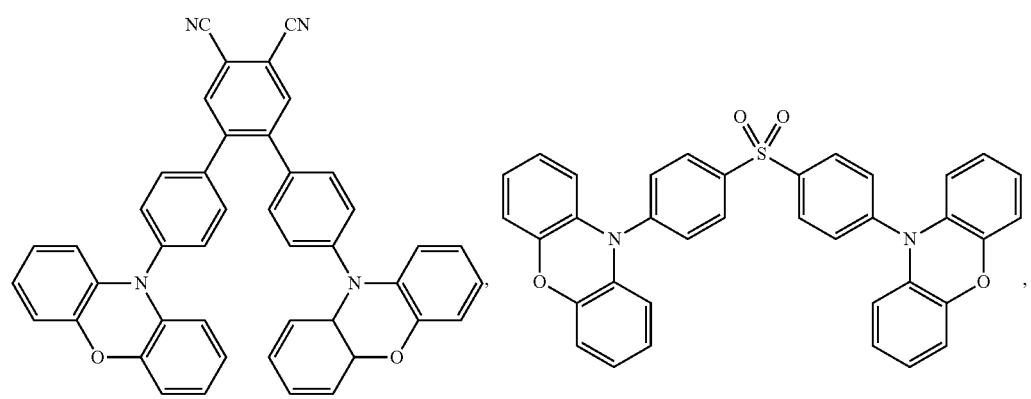
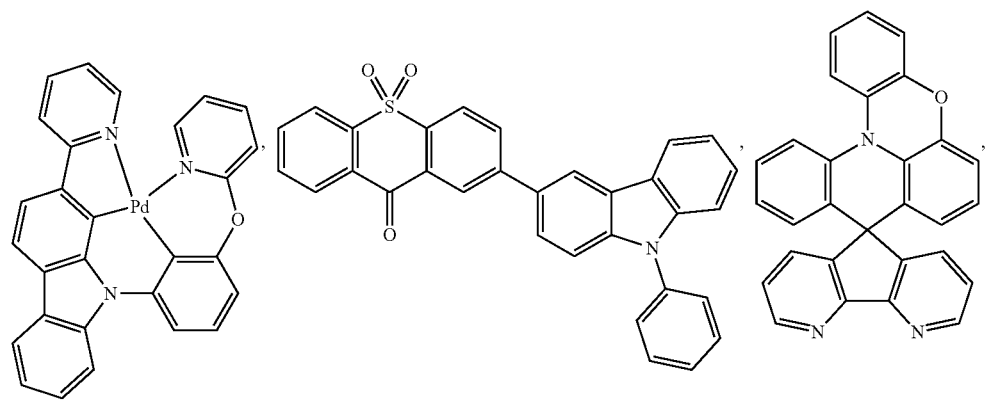
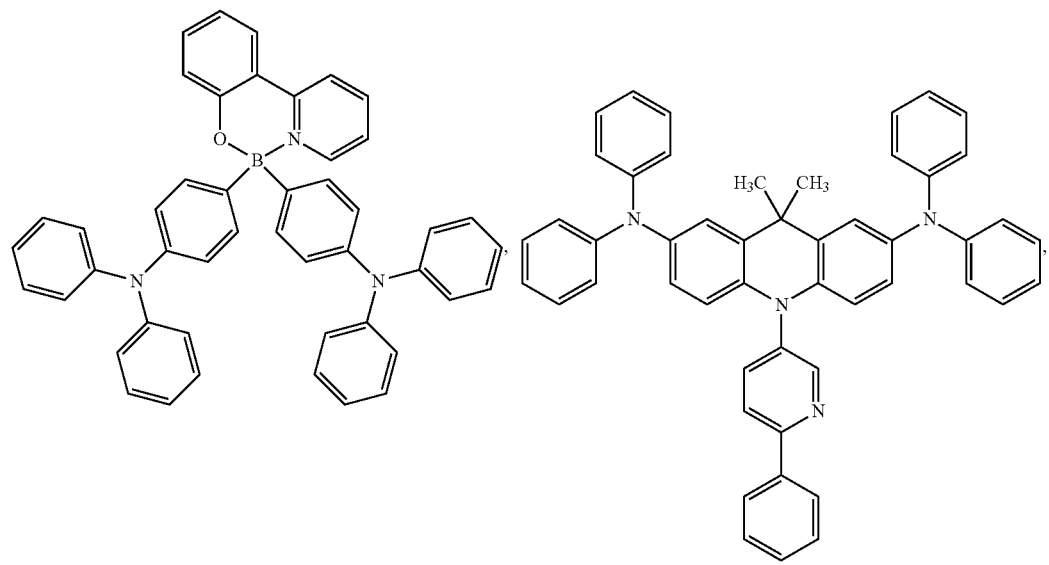

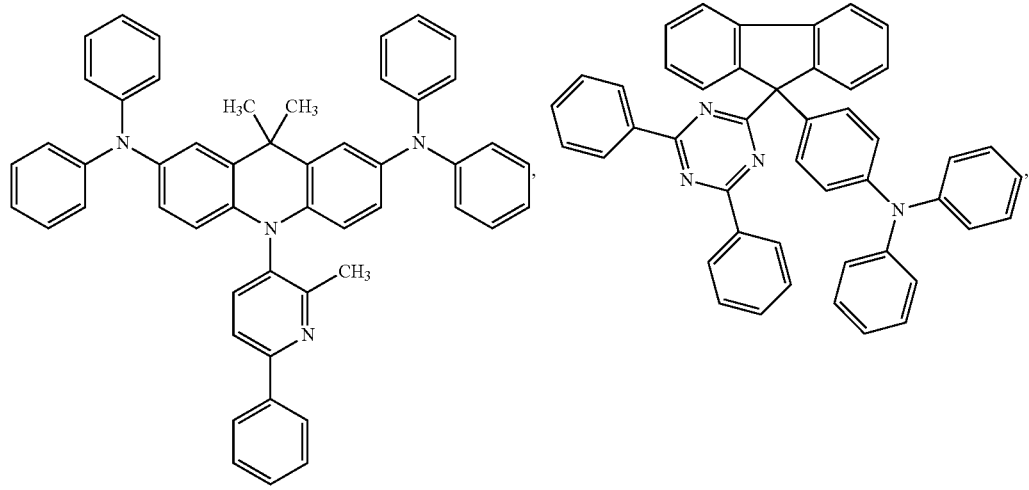
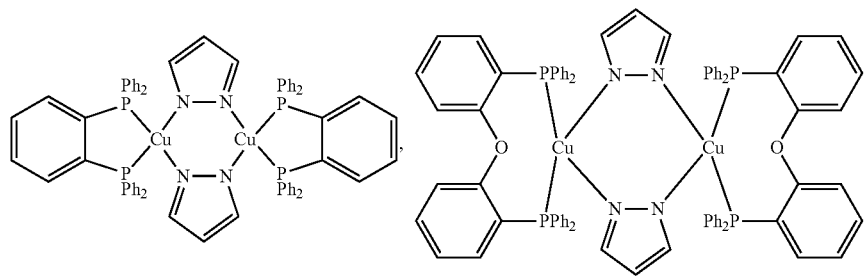
In an embodiment, the second ethylenically unsaturated monomer has a structure of the formula (16):
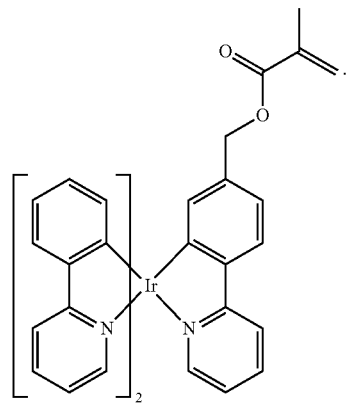
(16)
An exemplary brush polymer is shown in the formula (17) below
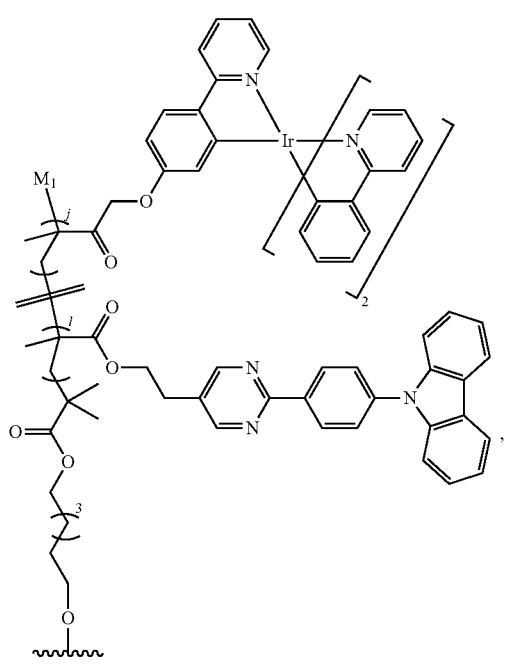
(17)

where "l" and "j" are repeat units in the formula (17) and $M_1$ is a halogen, examples of which are bromine, chlorine or iodine. In an embodiment, "l" is 1 to 10000 and "j" is 1 to 10000, while $M_1$ is bromine or hydrogen. As noted above, the bromine may be removed during the polymerization reaction or after the polymerization reaction. The $M_1$ group is removed if desired.

In an embodiment, the ratio of l to j in the first region, in the second region and the third region is 1000:1 to 5:1. In one embodiment, the amount of the emitter moiety in the brush polymer (the first, second and/or third brush polymer) is 0.1 to 15 mole percent.

In yet another embodiment, the brush polymer may be a diblock copolymer with a first block that comprises a homopolymer and the second block comprises a random copolymer comprising units of the first ethylenically unsaturated monomer and the second ethylenically unsaturated monomer. The homopolymer may comprise units of the first ethylenically unsaturated monomer and the second ethylenically unsaturated monomer. Ethylenically unsaturated monomers of the formulas (1) and (5) through (10) above may be used in the homopolymer (that forms the first block) and in the random copolymer that is part of the second block. Ethylenically unsaturated monomers of the formulas (11) through (16) may be used in the homopolymer as well as in the random copolymer that is part of the second block.

In an exemplary embodiment, the brush polymer has the structure of formula (18)

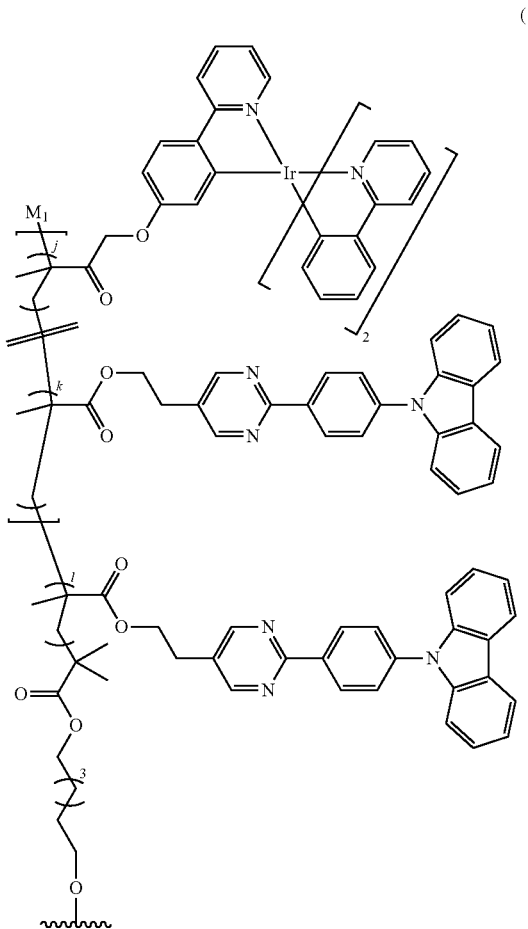

(18)

where l, k and j in formula (18) represent the number of repeat units respectively and $M_1$ represents a halogen, examples of which are chlorine, bromine or iodine. In an embodiment, l ranges from 1 to 10000, k ranges from 1 to 10000, and j ranges from 1 to 10000, and $M_1$ is bromine or hydrogen.

In one embodiment, in one manner of manufacturing the OLED display, the first ethylenically unsaturated monomer and the second ethylenically unsaturated monomer in the desired ratio (e.g., the first ratio) are mixed with a suitable solvent and are then disposed on a first region of the substrate. Other regions of the substrate are covered with a mask. The polymerization is then conducted using electromagnetic radiation to form the first brush polymer. Preferred radiation is UV or visible light. When the polymerization in the first region is completed, the substrate is (optionally) washed with a solvent, and the first ethylenically unsaturated monomer and the second ethylenically unsaturated monomer in the desired ratio (e.g., the second ratio) are mixed with a suitable solvent and are then disposed on a second region of the substrate. Other regions of the substrate are covered with a mask. The polymerization is again conducted using electromagnetic radiation to form the second brush polymer in only the second region. Other regions of the substrate may have brush polymers disposed thereon in a similar manner. The substrate may be washed between each polymerization step.

In another embodiment, the first ethylenically unsaturated monomer and the second ethylenically unsaturated monomer in the desired ratio (e.g., the first ratio) are mixed with a suitable solvent and are then disposed on the entire substrate. Portions of the region are irradiated with electromagnetic radiation while other regions are covered with a photomask. When the exposed regions are reacted, the mask is then removed, subjecting the other regions to the radiation to effect the reaction.

The solvent is preferably one that can dissolve the reactants involved in the manufacture of the polymer brush. In an embodiment, it is preferable for the solvent to dissolve the first ethylenically unsaturated monomer, the second ethylenically unsaturated monomer or both the first ethylenically unsaturated monomer and the second ethylenically unsaturated monomer. Depending upon the chemistry of the first ethylenically unsaturated monomer and the second ethylenically unsaturated monomer the solvent may be a protic or an aprotic polar solvent. Aprotic polar solvents such as propylene carbonate, ethylene carbonate, ethyl acetate, chloroform, butyrolactone, acetonitrile, benzonitrile, nitromethane, nitrobenzene, sulfolane, dimethylformamide, N-methylpyrrolidone, dimethylacetamide, anisole, o-xylene, p-xylene, m-xylene, or the like, or a combination thereof are generally desirable. Polar protic solvents such as, but not limited to, water, methanol, ethanol, propanol, isopropanol, butanol, or the like, or a combination thereof may be used. In some embodiments, solvents which have fewer environmental negative impacts, or toxicological negative impact may be preferentially selected. Solvents are used in an amount of at least 0.5 wt %, based on a total weight of a reaction mixture.

In an embodiment, UV radiation have a wavelength of 350 to 600, preferably 400 to 500 nanometers is used to effect the functionalization of the substrate and/or the polymerization of the first ethylenically unsaturated monomer and the second ethylenically unsaturated monomer. In an embodiment, the intensity of the UV radiation can be 0.001 to 5000 mW/cm$^2$, preferably 0.01 to 100 mW/cm$^2$ and more preferably 0.1 to 5 mW/cm$^2$. In an embodiment, the substrate is irradiated for 3 to 400 minutes, preferably 4 to 100 minutes and more preferably 5 to 10 minutes.

In another embodiment, the substrate with the ethylenically unsaturated monomers disposed thereon may be irradiated with visible light at an intensity of 0.001 to 5000 milliwatts per square centimeter ($mW/cm^2$). In an embodiment, the intensity of the visible light can be 0.001 to 100 $mW/cm^2$, preferably 0.01 to 10 $mW/cm^2$, and more preferably 0.1 to 1 $mW/cm^2$. In an embodiment, the substrate with the with the ethylenically unsaturated monomer disposed thereon is irradiated for 3 to 400 minutes, preferably 4 to 100 minutes and more preferably 5 to 10 minutes. In an embodiment, a photomask having filters that permits the use of two or more different light intensities (at the same time) may be employed. This provides a method to grow different thicknesses (potentially within a single pixel).

In one embodiment, by varying the molar ratio of the first ethylenically unsaturated monomer to the second ethylenically unsaturated monomer (i.e., by varying the ratio of the electroactive moiety to the emitter), or by varying the chemistry (the chemical structure) of the electroactive moiety and the emitter, light of different wavelengths may be emitted by the organic light emitting device.

In an exemplary embodiment, when the first ethylenically unsaturated monomer has the structure of formula (10) above and the second ethylenically unsaturated monomer has the structure of formula (16), varying the ratio of the second ethylenically unsaturated monomer to the first ethylenically unsaturated monomer can produce light of different wavelengths. The molar ratio of the electroactive moiety to the emitter can be varied from 1000 to 1.

In an embodiment (when the first ethylenically unsaturated monomer has the structure of formula (10) above and the second ethylenically unsaturated monomer has the structure of formula (16)), for blue light, the molar ratio of the first ethylenically unsaturated monomer to the second ethylenically unsaturated monomer can be very large (e.g., 1:100,000 to 1:infinity). In this embodiment, there is no second ethylenically unsaturated monomer used in the manufacturing of the brush polymer. Put another way, the first region of the substrate comprises a brush polymer that comprises only a single block produced by the polymerization of the structure of formula (10). The resulting brush polymer is a homopolymer. The light emitted by this brush polymer has a first wavelength. The first wavelength is 380 to 500 nanometers.

In this embodiment (when the first ethylenically unsaturated monomer has the structure of formula (10) above and the second ethylenically unsaturated monomer has the structure of formula (16)), in order to emit light having a wavelength of 380 to 500 nanometers (e.g., blue light), the molar ratio of the electroactive moiety to the emitter can be varied from 1000:1 to 1:3. In order to emit light having a wavelength of 460 to 680 nanometers (green light), the molar ratio of the electroactive moiety to the emitter can be varied from 1000:1 to 1:3. In order to emit light having a wavelength of 560 to 740 nanometers (red light), the molar ratio of the electroactive moiety to the emitter can be varied from 1000:1 to 1:3.

In yet another embodiment, by varying the chemistry of the first ethylenically unsaturated monomer and the second ethylenically unsaturated monomer that are used to form the brush polymer, the wavelength of light emitted by different regions of the substrate can be varied. In this embodiment, the first ethylenically unsaturated monomer may have the structure of any one of formulas (1) and (5) through (10) while the second ethylenically unsaturated monomer may have the structure of any one of formulas (11) through (16). In an exemplary embodiment, the first ethylenically unsaturated monomer has the structure of formula (10) while the second ethylenically unsaturated monomer has the structure of any one of the moieties shown in the formula (12) through (15f). The wavelength of emitted light may vary from 380 to 740 nanometers depending upon the structures selected for the first ethylenically unsaturated monomer and the second ethylenically unsaturated monomer.

According to an embodiment, a device including the block copolymer brush can be formed by a method described herein. According to an embodiment, the device is a light emitting diode. In an embodiment, the device is an organic electronic device including at least two electrodes and a semiconducting layer comprising at least one hole-transporting semiconducting material or at least one electron-transporting semiconducting material, wherein the at least one of the semiconducting materials is a semiconducting polymer brush that is covalently or ionically bonded to the surface of at least one of the electrodes.

An advantage of the novel iridium (III) photocatalysts is that they can be used to grow patterned, electronically active, polymer brushes from indium tin oxide (ITO) using visible light. Notably, the iridium (III) species can act in three roles 1) as photocatalysts to initiate/mediate polymerization, 2) as comonomers with a carbazole-based electroactive moiety and 3) as phosphorescent emitters. The brush polymers developed herein may be used to produce OLEDs that emit different colors depending upon the ratios of the host to the emitter. Different colors may also be produced by combining different ethylenically unsaturated monomers in the blocks.

Low energy visible light is used to graft patterned emissive polymer brushes from ATRP initiator functionalized ITO. Novel iridium complexes bearing a pendent methacrylate (IrXMA) are synthesized and utilized for the dual purpose of catalyzing/mediating controlled radical polymerization and harnessing triplet energy through radiative phosphorescence. The grafting of semiconducting methacrylate-based brushes using photo-ATRP provided emission spanning the visible spectrum, from blue to red, dictated by the ligand (X) of the iridium complex or lack thereof. Moreover, the iridium (Ir) emitter content within the brushes is controlled by the monomer feed ratio. The production of high resolution micron sized features and control over brush thickness with irradiation time demonstrate spatiotemporal control with this procedure. Moreover, the generation of electronically active diblock copolymer architectures is possible. The facile fabrication of red, green, and blue pixel arrays for white emission and a working multicolored OLED prototype showcased the utility of this methodology for display applications.

Figure 9:
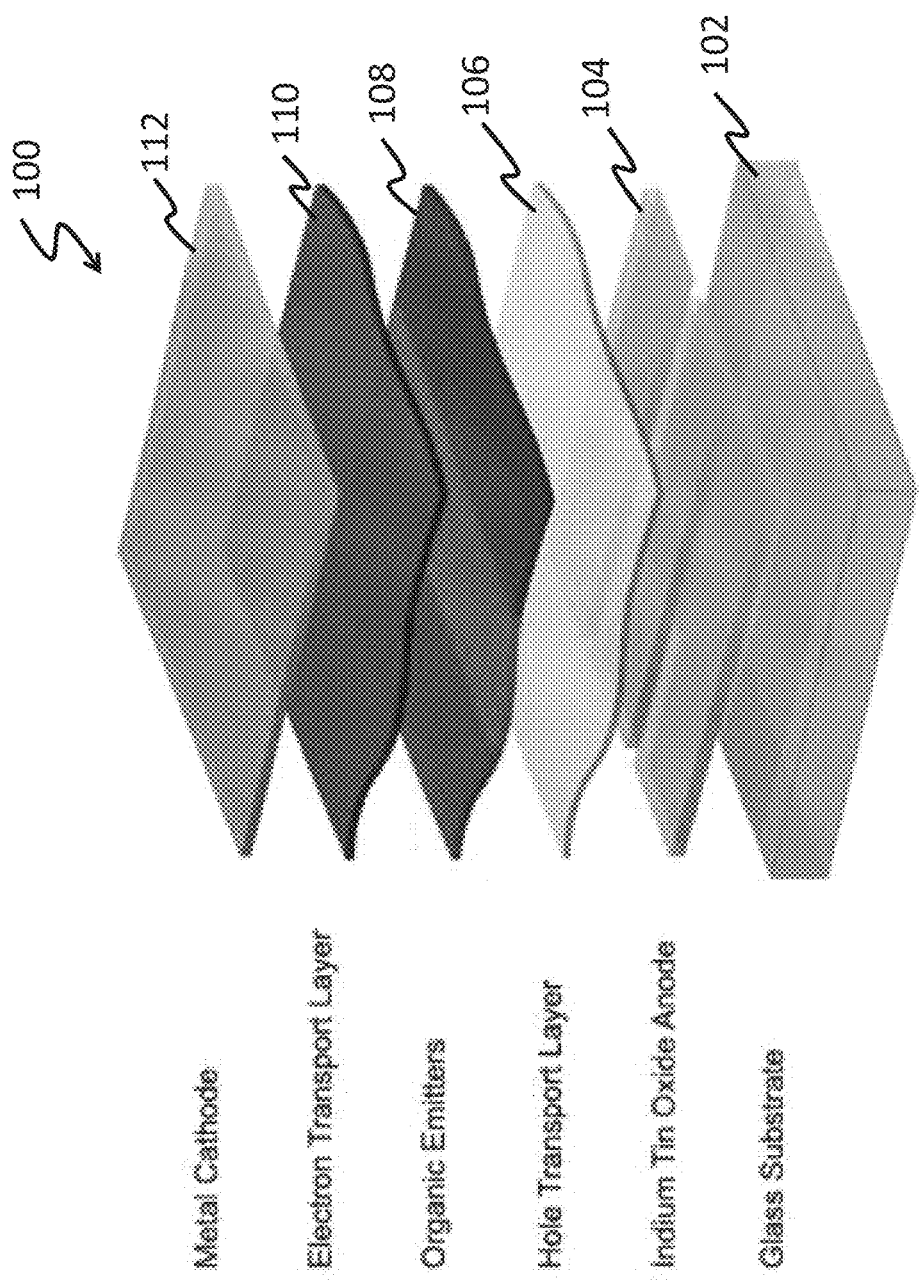
FIG. 9 is an exemplary schematic of a light emitting diode that comprises an emission layer that contains the brush polymers disclosed herein.

As noted above, the article disclosed herein may be used as an emissive layer in a display. FIG. 9 depicts one exemplary embodiment of a display 100. In an embodiment, a display device comprises a substrate 102 upon which is disposed in sequence an anode 104, a hole transport layer 106, an emission layer 108, an electron transport layer 110 and a cathode 112. The emission layer 108 comprises the brush polymers and copolymers disclosed herein. The emission layer comprising the brush polymers may thus have layers of other materials or emitters disposed below them and/or above them. In an embodiment, the substrate 102 is an optically transparent substrate. The anode 104 may be an indium tin oxide anode. Materials for the hole transport layer 106 and the electron transport layer 110 are previously described in formulas (1) through (15g). The emissive electroluminescent layer is a film of organic compound that emits light in response to an electric current.

In another embodiment with reference to the FIG. 9, the brush polymer may comprise electroactive moieties that are used to form each of the layers 106, 108 and 110 shown in the FIG. 9. For example, a first electroactive moiety reactively bonded to the polymer backbone may comprise a hole transport layer moiety, the second electroactive moiety (also reactively bonded to the polymer backbone) may comprise the host moiety, the third electroactive moiety (also reactively bonded to the polymer backbone) may comprise the emitter moiety, a fourth electroactive moiety (also reactively bonded to the polymer backbone) may comprise the electron moiety, and so on. Temporal control may be used to achieve this particular layering of the different electroactive moieties of the brush polymer. After the polymerization, the cathode 112 may be added to the plurality of layers described above to form a display.

In an embodiment, the display devices may be a pixelated light emitting diode that can emit light of single color (a single wavelength) or of a plurality of colors (light having different wavelengths). For example, it can emit white light or can emit red, green and blue light that can be combined to produce white light. The article may be used to produce light in the entire visible light spectrum.

In an embodiment, the display device may be a micro organic light emitting diode or a white organic light emitting diode (WOLED). The WOLED may have a color conversion layer. The color conversion layer may comprise periodical nanospheres that help extract the confined light in the device and also increase the effective light path to achieve more efficient color conversion.

The emissive layer disclosed herein may be used in flat displays, curved displays, transparent displays and in multilayer displays.

The emissive layer disclosed herein may be used as lighting such as, for example, white lighting, red lighting, conformal light coatings, color adjusting lighting, lighting for sign boards, or the like.

In an embodiment, the plurality of brush polymers form an emissive layer that emits fluorescent light and/or phosphorescent light. In another embodiment, the plurality of brush polymers further form at least one of a host emission layer, a hole transport layer, a hole injection layer and/or an electron transport layer in addition to the emissive layer; and where at least one of the host emission layer, a hole transport layer, a hole injection layer and/or an electron transport layer contact the emissive layer.

In an embodiment, the emissive layer is part of an electroemissive device that contains a cathode and an anode disposed on opposing sides of the emissive layer.

In another embodiment, a device comprising the emissive layer comprises a display that comprises light emitting pixels that are activated to display individual colors or color combinations.

In another embodiment, the device is a light source that emits light of a single color or of a plurality of colors. In an embodiment, the device emits white light. The emitted light is transmitted through a color conversion layer. The color conversion layer comprises a multiplicity of pixels of a multiplicity of colors.

In an embodiment, the device is a light emitting diode. In yet another embodiment, the device is a white organic light emitting diode.

The emissive layer disclosed herein may be used as lighting such as, for example, white lighting, red lighting, conformal light coatings, color adjusting lighting, lighting for sign boards, or the like.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

The invention is exemplified by the following non-limiting examples.

EXAMPLE

The following components are used in the examples. Unless specifically indicated otherwise, the amount of each component is in weight percent in the following examples, based on the total weight of the composition.

Physical measurements were made using the tests and test methods described below. Light sources. 405 nm (model M405L3-C1) and 465 nm (model M470L3-C1) collimated light emitting diodes were run through a T-Cube LED driver (model LEDD1B) (power supply unit—KPS101), all purchased from ThorLabs. The light intensity was measured using an attenuated photodiode detector purchased from Newport Corporation (Model 818-UV/DB). Spectrophotometer with cosine corrector and radiometric calibration was purchased from Ocean Optics (model USB 4000) and used to measure the LED emission profile.

Optical micrographs were captured with a Nikon Elipse E600 optical microscope in reflectance mode and a Keyence VHX-5000 digital microscope.

Tapping mode AFM experiments were performed using a MFP-3D system (Asylum Research, Santa Barbara, Calif.) to identify patterned polymer brushes and determine brush thicknesses. The measurements were conducted using commercial Si cantilevers.

XPS was performed using a Kratos Axis Ultra Spectrometer (Kratos Analytical, Manchester, UK) with a monochromatic aluminum Kα X-ray source (1486.6 eV) operating at 225 W under a vacuum of 10–8 Torr and spectra were analyzed using CasaXPS software.

SIMS imaging was performed using a Camera IMS 7f system (Camera SAS, Gennevilliers, France). A 10 kV Cs+ ion beam and 5 kV negative sample potential were used, for a total impact energy of 15 kV.

Example 1

This example demonstrates the method of manufacturing an OLED on an indium tin oxide ITO substrate.

In this example, indium tin oxide (ITO) is chosen as the grafting-from substrate due to its well established utility as a transparent electrode in organic electronics. Alkenes are grafted to ITO substrate using UV light, which uniquely provides spatial control.

With reference again to the FIG. 1, the ITO functionalization is started with base piranha or air plasma treatment to expose surface hydroxyls, followed by deposition of 5-hexeneol onto the surface and irradiating with 254 nm UV light (2 mW/cm$^2$) for 16 hours (Scheme 1, step 1). Subsequently, the functionalized ITO is acylated with α-bromoisobutyryl (BIBB), then briefly sonicated (~1 min) to clean the surface of physisorbed material.

X-ray photoelectron spectroscopy (XPS) confirms the presence of an initiator layer through detection of bromine (Br3p at 185 eV) and carbonyl (C1s, C=O at 289 eV) functionalities. Light-mediated atom transfer radical polymerization (photo-ATRP) is accomplished with two monomer derivatives, 2-(2-(4-(9H-carbazol-9-yl)phenyl)pyrimidin-5-yl)ethyl methacrylate (M6MA) (see Formula (10)), and bis[[2-(X)]4-(pyridin-2-yl)oxymethylmethacrylate]-iridium (III) (IrXMA) (see Formula (16)), where X represents the C^N ligands that dictate triplet energy (T1), and thus emission color, as energy is transferred from M6MA (host) to IrXMA (emitter) (vide infra).

N-Methyl-2-pyrrolidone (NMP) is selected as the solvent because of its ability to effectively dissolve the monomers and corresponding linear polymers prepared using free radical polymerization. A typical grafting-from procedure is as follows: In a glovebox a 1M solution of M6MA (~20 mg)+IrXMA (1-12 mol % for copolymers) in NMP was placed onto initiator functionalized ITO, followed by laying a glass coverslip or photomask onto the solution, and illuminating with visible light (Scheme 1, step 2). Although both 405 and 465 nm collimated LEDs were found to be effective, the 465 nm light (0.4 mW/cm$^2$) is used for most copolymerizations due to its deeper penetration through the solution, given ~2-3× less absorption by IrXMA at 465 nm relative to 405 nm.

In other words, reduced light attenuation provides more active photons at the ITO/monomer interface. After irradiation, the polymer-brush coated substrates were washed thoroughly with CH$_2$Cl$_2$ using sonication or Soxhlet extraction.

Initially, M6MA homopolymer brushes were grafted from ITO, using Ir(ppy)3 (0.005 mol %) as the photocatalyst and 405 nm irradiation (4 mW/cm2). The resulting brushes emitted a bright blue fluorescence ($\lambda$max=405 nm) under UV excitation ($\lambda$ex=365 nm), characteristic of poly(M6MA).

Example 2

This example was conducted to demonstrate how changing the chemistry of the second ethylenically unsaturated monomer will change the wavelength of light emitted by the brush polymer.

Figure 2:
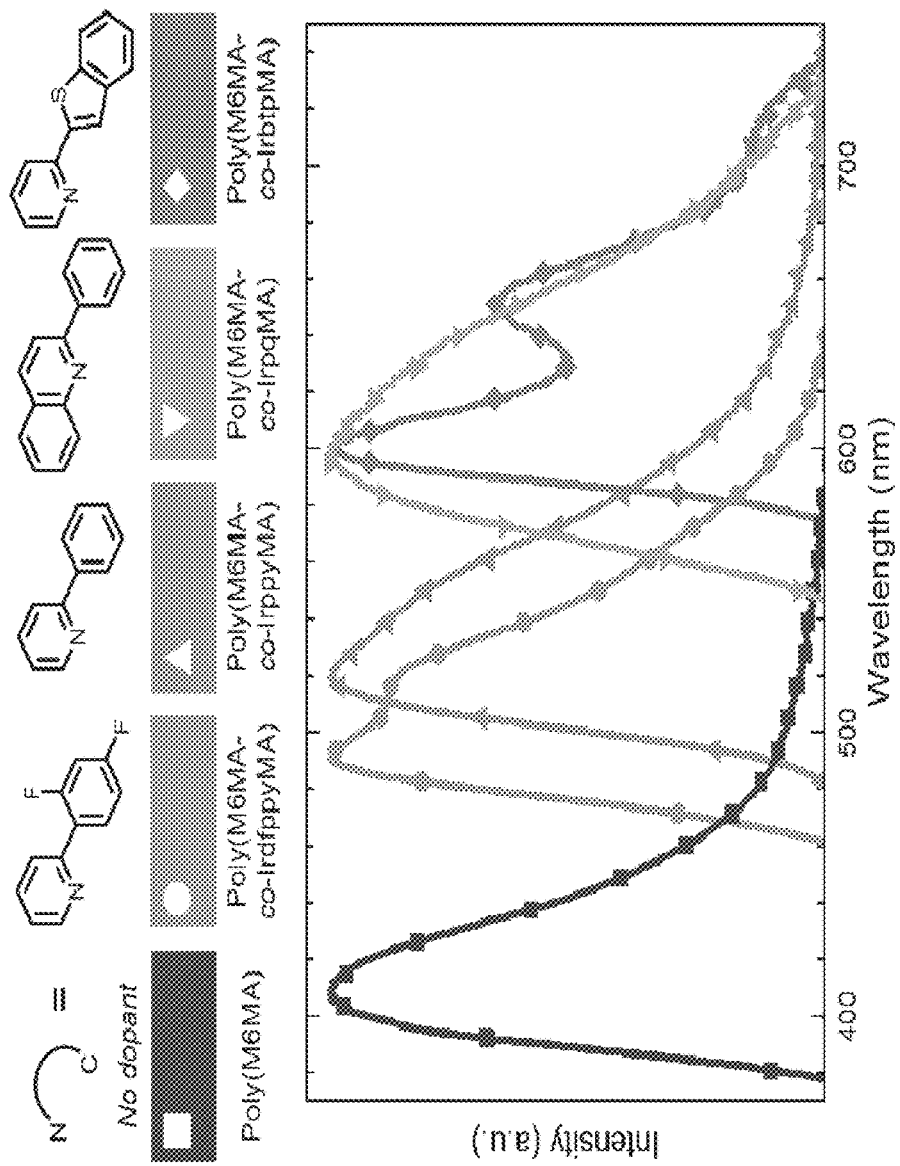
FIG. 2 shows the different C^N (MO groups and the graph depicts the corresponding emitted light of different wavelengths; where C^N refers to a ligand that coordinates through one carbon atom and one nitrogen atom to a metal center. In this case, phenyl pyridine based ligands were used to coordinate with Ir(III)

Substituting Ir(ppy)3 with IrXMA (1-12 mol %), where X represents the C^N ligands difluorophenylpyridine (dfppy), phenylpyridine (ppy), phenylquinoline (pq), or benzothiophenylpyridine (btp), and growing brushes using 465 nm irradiation (0.4 mW/cm$^2$) provided a library of polymer brushes having green-blue, green, orange, and red phosphorescence, respectively. FIG. 2 shows the different C^N (X) groups and the graph depicts the corresponding emitted light of different wavelengths. Due to the larger quantities of photocatalyst/emitter used very little energy input is used for copolymer brush growth. The energy is as low as 0.04 mW/cm$^2$ (405 nm), which is one to two orders of magnitude less than that used for other controlled photopolymerizations.

Photoluminescence measurements ($\lambda_{ex}$=340 nm) of the copolymer brushes showed emission profiles, with $\lambda_{max}$ ranging from 490-600 nm, with no residual fluorescence from the host (M6MA), which suggests excellent energy transfer to the Ir(III) emitters. The efficient energy transfer is due to the high triplet energy (T1) of the M6MA host (T1≈2.8 eV), relative to the IrXMA emitters (T1≤2.7 eV).

A survey of the surface with XPS confirmed the chemical compositions for the five different brushes, showing distinct N1s peaks (400 eV) for all five brushes, Ir4f peaks (60 eV) for the four copolymers, as well as F1s peaks (687 eV) for poly(M6MA-co-IrdfppyMA) brushes and S2s (228 eV) and S2p (164 eV) peaks for poly(M6MA-co-IrbtpMA) brushes. Moreover, no residual indium (444 eV) or tin (485 eV) signals are observable with XPS for the five brush samples, suggesting uniform coverage with thicknesses exceeding ~10 nm.

Example 3

This example is conducted to demonstrate how changing the molar ratio of the second ethylenically unsaturated monomer to the first ethylenically unsaturated monomer may be used to change the wavelength of light emitted.

The host to emitter ratio affects the overall OLED device performance, and as such it is desirable to have control over the relative incorporation of Ir. To test whether the feed ratio of IrXMA correlated with the incorporation, five different polymer brushes were grafted uniformly from ITO using variable amounts of IrppyMA (0, 1, 3, 6, and 12 mol % respectively). XPS was used to determine the chemical composition of the five different films showing a clear increase in the Ir4f$_{7/2}$ and Ir4f$_{5/2}$ signals at binding energies of 60 and 63 eV, respectively, as the IrppyMA loading was increased. FIG. 3A depicts the XPS that was used to determine the chemical composition of the five different films.

FIG. 3B is a graph that shows that the atomic percent of Ir, relative to carbon, oxygen, and nitrogen, is in good agreement with theoretical values. Notably, the atomic percent of Ir, relative to carbon, oxygen, and nitrogen, is in good agreement with theoretical values, albeit typically lower than targeted (0.4, 2.6, 4.4 and 9.7 mol % Ir detected for 0, 1, 3, 6, and 12 mol % loading). The lower than theoretical values may be due to common organic contaminants containing carbon, oxygen, and nitrogen. Additionally, photoluminescence measurements on the four copolymer samples revealed a slight bathochromic shift and broadening of emission for higher IrppyMA loadings, which can be observed in the photoluminescence images ($\lambda_{ex}$=365 nm) provided as an inset in FIG. 3A. The notable red-shift and broadening is consistent with the analogous spun-cast linear polymer samples as Ir emitter content is increased. Specifically, for the 1, 3, 6, and 12 mol % IrppyMA loaded brushes on ITO a $\lambda_{max}$ of 514, 518, 521, and 525 nm, respectively, is measured, while, congruently, a full width at half maximum (FWHM) of 76, 79, 81, and 83 nm is calculated. The XPS and photoluminescence measurements indicate that this methodology can be used effectively to target polymer brushes with specific emitter contents to achieve optimal device performance.

Example 4

Figure 4A:
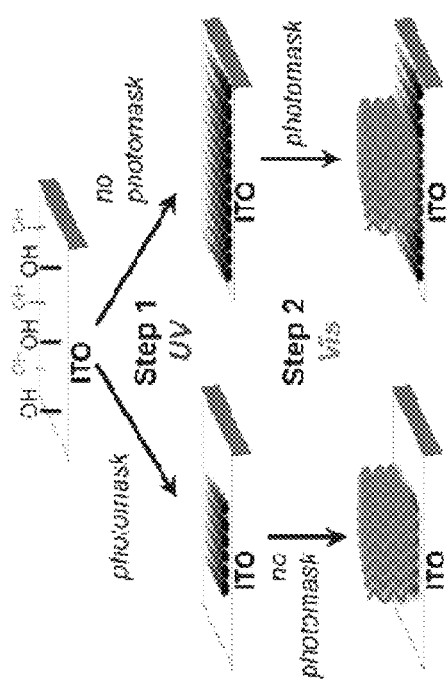
FIG. 4A depicts a schematic representation of the method used to reactively bond the brush polymer to the substrate.
Figure 4B:
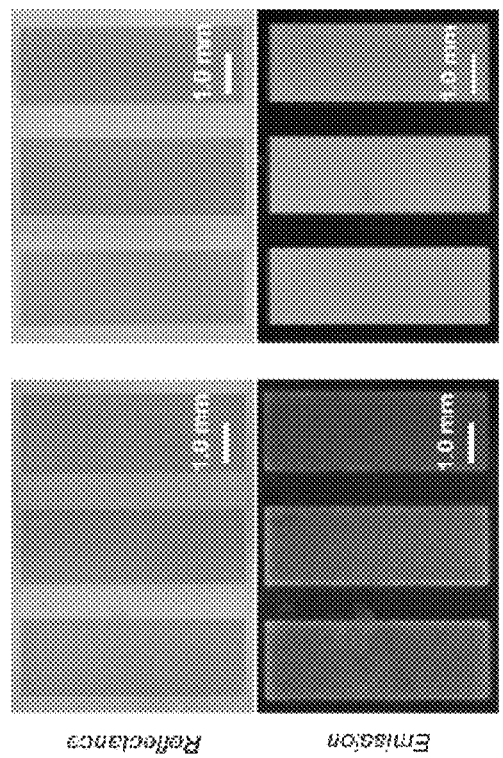
FIG. 4B depicts corresponding reflectance and photoluminescence images (step 1—left, and step 2—right)

This example is used to demonstrate the ability to regulate grafting position (e.g., spatial control) that is used for multicolored pixel arrays and can be achieved with the use of photomasks. FIG. 4 (see Step 1) shows the use of spatial control during initiator functionalization or during photopolymerization (see Step 2). FIGS. 4A and 4B exemplify spatial control demonstrated with poly(M6MA-co-IrppyMA) brushes containing ~6 mol % IrppyMA, and irradiation through a chrome coated quartz photomask at either step 1 (UV) or step 2 (visible light). FIG. 4A depicts a schematic representation of the functionalization, while FIG. 4B depicts corresponding reflectance and photoluminescence images (step 1—left, and step 2—right).

First, spatial control during initiator functionalization (step 1) occurs by placing a chrome coated quartz photomask with millimeter sized transparent rectangles onto 5-hexeneol that is layered on top of a pre-cleaned ITO substrate, followed by irradiating the sample for 4 hours through the photomask using a 254 nm UV capillary light source (6 mW/cm$^2$). After acylation with BIBB the ATRP initiator functionalized substrate is coated with a 1M solution of M6MA and IrppyMA (6 mol %) in NMP, sandwiched with a non-patterned glass coverslip on top, and uniformly irradiated for one hour.

Reflectance and photoluminescence imaging indicated preferential growth of polymer brushes in the regions that were exposed to UV light during step 1 (FIG. 4, left side). However, careful observation of the emission image revealed minor brush growth outside of the rectangles, which is likely due less efficient acylation of ITO surface hydroxyls with BIBB. Alternatively, uniform initiator functionalization, followed by irradiation with visible light (465 nm) through the same photomask (mask 1) provides the same polymer brushes, poly(M6MA-co-IrppyMA), with little-to-no observable photoluminescence outside the regions that were irradiated (FIG. 4, right side, see step 2).

Example 5

This example is used to demonstrate a correlation between reflectance color and thickness of patterned polymer brushes that were grown for different lengths of time. To establish a correlation between reflectance color and thickness, patterned polymer brushes were grown for different lengths of time, which simultaneously provided insight into temporal control. Initially a chrome coated glass photomask with horizontal 20×200 μm transparent rectangles was used to grow poly(M6MA) brushes using 405 nm light (4 mW/cm$^2$) with four different irradiation times (10, 40, 60, and 120 min.). Subsequently, a similar photomask, but with vertical 200×20 μm transparent rectangles was used to grow the same homopolymer under identical grafting conditions, with four different irradiation times (20, 45, 60, and 90 min.).

FIGS. 5A-5D depict one manner of achieving temporal control using patterned poly(M6MA) and poly(M6MA-co-IrppyMA) brushes on ITO. FIG. 5A shows reflectance (left) and photoluminescence (right) images of 2 20×200 μm lines grown for different lengths of time (40 and 60 min. for horizontal and vertical, respectively) and interwoven to provide different heights (43, 55, and 85 nm for horizontal, vertical, and intersection, respectively). FIG. 5B depicts a 3D topographical image of a pattern obtained using AFM. FIG. 5C shows correlation between reflectance color and brush thickness; boxed regions are images of sections measured with AFM and regions between are generated color gradients. FIG. 5D shows reflectance (top) and photoluminescence (bottom) images of copolymer brush squares at different time intervals, with 6 mol % IrppyMA used as catalyst/emitter.

The resulting interwoven patterns contain three different brush thicknesses within a small 40 μm$^2$ window, corresponding to 1) horizontal lines, 2) vertical lines and 3) their 20×20 μm square point of intersection as shown in FIG. 5A. On two substrates four different regions each containing three brush heights were generated, providing a total of 24 different color/thickness data points for all images). The different brush thicknesses were evident in the reflectance images (FIG. 5A) and confirmed using atomic force microscopy (AFM) (FIG. 5B).

For best precision, a common cold white LED source was used for all reflectance imaging and the color coordinates (L*, a*, b*) were determined as a means of quantification.

AFM revealed thicknesses up to 120 nm, which were correlated to the respective reflectance colors to generate a gradient as shown in FIG. 5C. In the FIG. 5C, the boxed regions are actual reflectance images, with their center denoted by a cross that corresponds to the specific thickness on the axis, while the 2-point color gradients in between each boxed region was generated from the respective L*,a*, b* values as a representation of the theoretical color for a given thickness.

The distinct color variations for minute changes in brush thickness allows for a relatively accurate (±10 nm) and rapid determination of brush height by simply observing the color of reflected light. In addition, from these results emerged a clear correlation between polymerization time and brush thickness, which is evidence for temporal control.

Specifically, 6 mol % IrppyMA is copolymerized with M6MA using 465 nm irradiation (0.4 mW/cm$^2$) through chrome-coated glass photomasks with millimeter sized transparent square masks.

Both reflectance and photoluminescence images shown in FIG. 5D suggest that brush thickness increases with time, where reflectance color can be roughly correlated with thickness using FIG. 5C, providing ~15, 40, 60 and 80 nm for 5, 10, 20 and 40 minutes of irradiation, respectively.

Moreover, the increase in observable emission intensity over time correlates with an increase in brush thickness ($\lambda_{ex}$=365 nm). Thus, temporal control for copolymer brushes using high catalyst loadings is readily accessible with this approach.

Example 6

This example demonstrates the manufacturing of diblock brush polymers where the first block is a homopolymer manufactured from a first ethylenically unsaturated monomer, while the second block is a random copolymer that comprises repeat units of a first ethylenically unsaturated monomer and a second ethylenically unsaturated monomer.

This example also demonstrates that the bromide chain-ends were still existent/active after brush formation thus permitting the formation of the fabricating diblock copolymer architectures. From an OLED device perspective this provides an effective way to grow complex arrays where the first block may be a hole transporting layer (HTL) and the second block an emissive layer (EML), both with pre-defined thicknesses controlled through irradiation time. The hole transporting layer comprises poly(M6MA) as the first block, reacted over a large area of approximately 7×12 mm on a 15×20 mm initiator functionalized ITO substrate. After thorough washing, the copolymer brushes containing M6MA and IrppyMA (3 mol %) were grown through a mask 3 containing vertical 200×20 μm rectangles and spans approximately a 13×18 mm square area of the substrate.

Figure 6A:
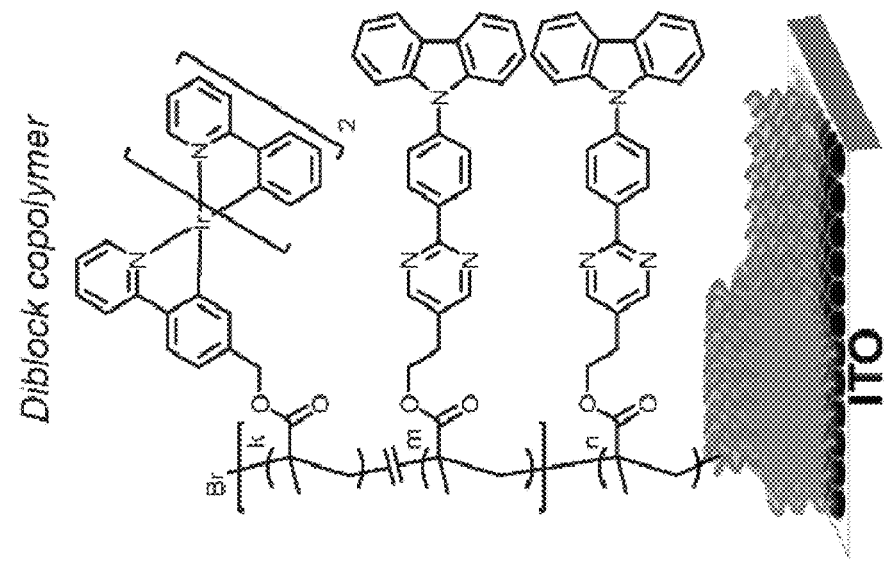
FIG. 6A depicts a representation of polymer brushes on ITO and chemical structure for poly(M6MA-b-(M6MA-co-IrppyMA))
Figure 6B:
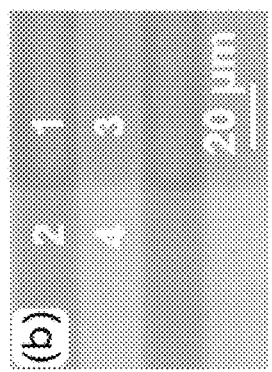
FIG. 6B depicts a reflectance image showing four distinct regions: 1. ATRP initiator functionalized ITO; 2. poly (M6MA); 3. poly(M6MA-co-IrppyMA); and 4. poly (M6MA-b-(M6MA-co-IrppyMA))
Figure 6C:
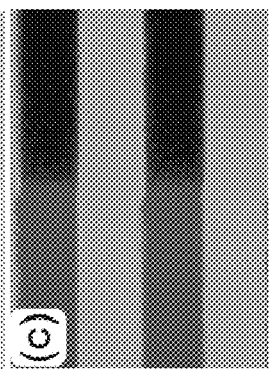
FIG. 6C depicts a photoluminescence image of the image of FIG. 6B.
Figure 6D:
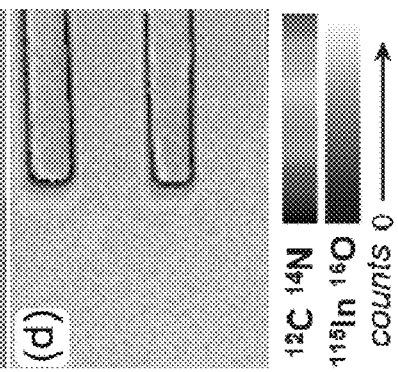
FIG. 6D shows a SIMS showing overlay of $^{12}C$ $^{14}N$ (color) and $^{115}In^{16}O$ (greyscale)

This provides four distinct regions on one substrate; 1) ATRP initiator functionalized ITO, 2) poly(M6MA) homopolymer, 3) poly(M6MA-co-IrppyMA) random copolymer, and 4) poly(M6MA-b-(M6MA-co-IrppyMA) block copolymer. FIG. 6A depicts a representation of polymer brushes on ITO and chemical structure for poly(M6MA-b-(M6MA-co-IrppyMA)). FIG. 6B depicts a reflectance image showing four distinct regions: 1. ATRP initiator functionalized ITO; 2. poly(M6MA); 3. poly(M6MA-co-IrppyMA); and 4. poly(M6MA-b-(M6MA-co-IrppyMA)). FIG. 6C depicts a photoluminescence image of the image of FIG. 6B, while FIG. 6D shows a SIMS showing overlay of $^{12}$C $^{14}$N (color) and $^{115}$In $^{16}$O (greyscale).

FIG. 6A shows different reflectance colors for each region, with a corresponding brush thickness of ~50, 60 and 90 nm for regions 2, 3, and 4, respectively, while the photoluminescence image indicates that the emitter resides only in the 20×200 μm rectangles (green phosphorescence). The surface was further characterized with secondary ion mass spectrometry (SIMS), showing only an indium signal (from the indium tin oxide substrate) in the unexposed regions, while nitrogen is found everywhere else, which attests to the excellent spatial control obtainable with this methodology. The reflectance, photoluminescence, and SIMS characterization suggests that the bromide chain end is active after initial brush formation, allowing for re-initiation and growth of a second luminescent block.

Example 7

This example demonstrates that the high degree of spatial control achievable with the brush polymers allows for the preparation of multicolored pixel arrays that are often utilized to generate white light for display applications. FIGS. 7A-7D are used to show white emission from a red, green, and blue pixel array. FIG. 7A shows photoluminescence images ($\lambda_{ex}$=365 nm) of the three step RGBG array fabrication, going from red (poly(M6MA-co-IrbtpMA); 500×500 μm), to green (poly(M6MA-co-IrppyMA); 125×750 μm), to blue (poly(M6MA); 500×750 μm) pixels. FIG. 7B shows a photoluminescence microscopy image ($\lambda_{ex}$=365 nm) showing a magnification of the final pixelated sample (as indicated by the dotted white box in "FIG. 7A"). FIG. 7C shows a photoluminescence profile of the pixel array overlaid with individual red, green, and blue emission profiles. FIG. 7D depicts CIE 1931 coordinates for the sum emission profile shown as the white trace in "FIG. 7C" along with the individual red, (x,y)=(0.61,0.34), green, (x,y)=(0.32,0.61), and blue, (x,y)=(0.16,0.07), coordinates.

Three chrome-coated glass photomasks were fabricated to contain different sized transparent rectangles for red (500×500 μm), green (125×750 μm), and blue (500×750 μm) pixels (masks 9, 10, and 11, respectively). The utility of larger rectangles than those used in an actual display is because of ease of sequential mask alignment, however resolution on the order of microns is achievable with this method, which is competitive with state-of-the-art pixels for display applications (~5×5 μm). A simple substrate holder composed of black Delrin and stainless still pins was built and used to align the masks (with approximately ±100 μm accuracy).

Sequentially, poly(M6MA-co-IrbtpMA), poly(M6MA-co-IrppyMA), and poly(M6MA) brushes were grown from ITO, providing red, green, and blue emissive rectangles, respectively (See FIG. 7A). Reflectance microscopy reveals that the pixels had a thickness of around 90 nm for red and 110 nm for green and blue. FIG. 7B shows a photoluminescence microscope image of the sample under 365 nm excitation, demonstrating defined features for the RGBG arrangement. The total photoluminescence output from the array is measured in an integrating sphere ($\lambda_{ex}$=340 nm) to determine the emission profile (FIG. 7C) and chromaticity (FIG. 7D).

A 395 nm long-pass filter is used to measure emission over the entire visible spectrum (400-700 nm) without interference from the second harmonic of $\lambda_{ex}$, showing good overlay with individual emission profiles for red, green, and blue pixels that were measured independently. The chromaticity from the emission profile was generated following 1931 Commission Internationale de L'Éclairage (CIE) guidelines, identifying x,y coordinates of 0.35,0.32, which approaches near pure white emission (x,y=0.33,0.33). FIG. 7D also shows the individual CIE 1931 coordinates for red, (x,y)=(0.61,0.34), green, (x,y)=(0.32,0.61), and blue, (x,y)=(0.16,0.07), which exhibits the underlying color mixing process that results in the "white" light emission. The multicolored patterning demonstrates the ability for this methodology to be used as an effective way to fabricate pixel arrays for OLED display applications.

Example 8

A monochromatic and multicolored OLED devices was fabricated using the present grafting-from procedure. FIG. 8A provides a schematic representation of the multicolored device, with an architecture (from bottom up) of: ITO/EML/HBL/ETL/EIL/Al, where ITO is the anode, polymer brushes comprise the EML, 5-(4-([1,1'-biphenyl]-3-yl)-6-phenyl-1,3,5-triazin-2-yl)-7,7-diphenyl-5,7-dihydroindeno[2,1-b]carbazole acts as the hole blocking layer (HBL, 5 nm), 2,4-bis(9,9-dimethyl-9H-fluoren-2-yl)-6-(naphthalen-2-yl)-1,3,5-triazine comprises the electron transport layer (ETL, 35 nm), 8-hydroxy quinolinato lithium (LiQ) the electron injection layer (EIL, 2 nm), and aluminum (Al) the cathode (100 nm). Two polymer brushes, poly(M6MA-co-IrpqMA), an orange emitter, and poly(M6MA-co-IrppyMA), a green emitter, were grafted from six ITO pixels on one glass substrate using low intensity 465 nm irradiation (0.4 mW/cm$^2$) through two chrome-coated glass photomasks with three alternating transparent rectangles.

Based on reflectance color, the brushes were approximately 70 and 80 nm thick for poly(M6MA-co-IrpqMA) and poly(M6MA-co-IrppyMA), respectively. Applying forward bias on a fully fabricated device prototype led to observable electroluminescence for all six pixels, and two distinct colors (orange and green) as shown in FIG. 8B. Although device performance will undoubtedly benefit from the incorporation of a hole injection layer (HIL) and/or HTL between the ITO and EML, the potential utility of this grafting-from platform for OLED display applications is clearly demonstrated by the ability to obtain a working multi-colored device.

Example 9

Figure 10:
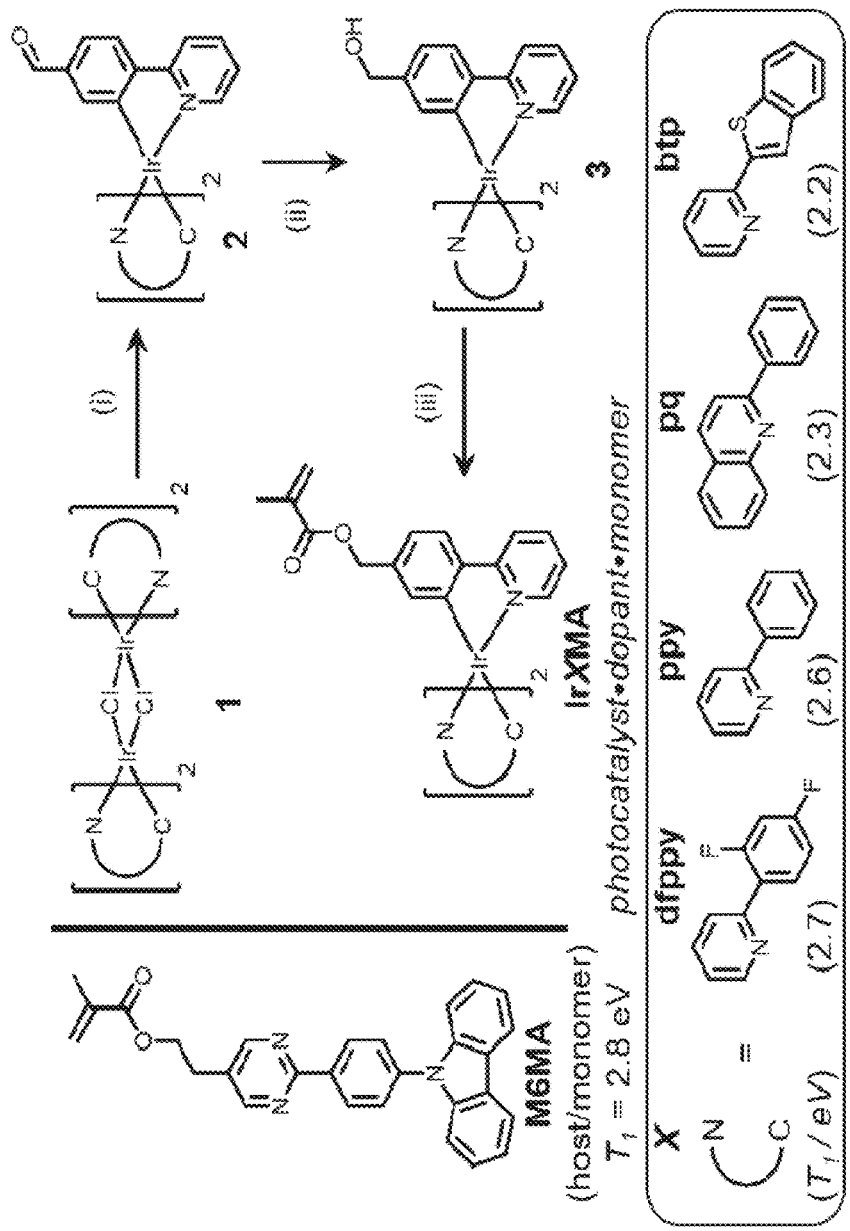
FIG. 10 depicts a reaction scheme for synthesizing ethylenically unsaturated monomers comprising a emitter moiety.

This example is conducted to demonstrate photopatterned growth of electronically active polymer brushes for white organic light emitting diode displays. The host monomer contains a carbazole-phenyl-pyrimidine moiety covalently attached to methacrylate, termed M6MA, which was conveniently prepared in four steps from commercial starting materials. Scheme 1 in the FIG. 10 provides the general synthetic strategy to the desired heteroleptic and functional facial (fac) Ir (III) complexes to prepare the μ-dichloro bridged dimer [Ir(X)$_2$-μ-Cl]$_2$ (1) from IrCl$_3$.xH$_2$O and one of four C^N ligands represented as X (vide infra), then splitting of the chloro-bridge with silver triflate (AgOTf) and coupling with 4-(pyridine-2-yl)benzaldehyde to yield compound 2. Aldehyde reduction on compound 2 with sodium borohydride yields the corresponding hydroxymethyl derivative (compound 3), followed by acylation with methacryloyl chloride to provide the desired iridium monomer, IrXMA, where the C^N ligand, X, dictates the triplet (T$_1$) energy and thus phosphorescence color. Specifically, X represents difluorophenylpyridine (dfppy), phenylpyridine (ppy), phenylquinoline (pq), or benzothiophenylpyridine (btp) (Scheme 1). To confirm whether the IrXMA monomers were compatible with M6MA under radical polymerization conditions, linear copolymerizations were attempted by simply heating the two monomers (94:6 mol %, M6MA: IrXMA) in anisole in the presence of azobisisobutyronitrile (AIBN). The polymerizations appeared to run similarly, independent of the IrXMA monomer, providing number average molecular weights ($M_n$) of 36±1 kDa and dispersities (Đ) of 2.4±0.1, relative to polystyrene standards. Additionally, the copolymers were found to have unique emission profiles dictated by the IrXMA comonomer, granting access to turquoise (dfppy), green (ppy), orange (pq), and red (btp) colors, while homopolymers of M6MA provide deep blue fluorescence.

The precise control over emitter incorporation makes the generation of white light possible through careful tuning of red, green, and blue emitting components using a random copolymer brush architecture. White OLEDs are useful as a source of low energy backlighting for display technology that achieves color by passing the light through a filter, such as a liquid crystalline display (LCD). White emission by copolymerizing IrbtpMA and IrppyMA with M6MA to mix red and green phosphorescence, respectively, while maintaining a low concentration of each, such that blue fluorescence from M6MA is not fully quenched by the emitters and can also be mixed in with the red and green.

A 1M solution of monomer in NMP (anh) was prepared inside of a glovebox, using M6MA, IrppyMA (0.2 mol % relative to M6MA), and IrbtpMA (0.25 mol % relative to M6MA). The mixture was added on top of an initiator functionalized ITO substrate and a chrome coated glass photomask was placed onto the solution. The samples were irradiated with a collimated 465 nm LED (0.4 mW/cm$^2$) for 2 hours. The light was turned off and the samples were removed from the glovebox, washed thoroughly with $CH_2Cl_2$, sonicated (1 minute) in $CH_2Cl_2$, and dried under a stream of nitrogen. By carefully tuning the feed ratio of the two IrXMA comonomers relative to M6MA, white emission is achieved with 0.2 mol % IrppyMA and 0.25 mol % IrbtpMA.

What is claimed is:

1. A device comprising:
   a substrate;
   where the substrate comprises a plurality of brush polymers that are covalently or ionically bonded to the substrate; where at least a portion of the brush polymers comprise a covalently bonded emitter moiety; where the brush polymers comprise a polymeric chain backbone that has an electroactive moiety extending radially outward from the chain backbone; and where the electroactive moiety is linked to the chain backbone by a covalent bond, an ionic bond or a hydrogen bond.

2. The device of claim 1, where the substrate comprises a first region comprising a first brush polymer and a second region comprising a second brush polymer; where the first brush polymer and the second brush polymer are covalently or ionically bonded to the substrate; where the first brush polymer comprises repeat units of a first ethylenically unsaturated monomer and a second ethylenically unsaturated monomer; where the first ethylenically unsaturated monomer comprises a first electroactive moiety and where the second ethylenically unsaturated monomer comprises a second electroactive moiety that is different from the first electroactive moiety; where at least one of the first electroactive moiety or the second electroactive moiety is an emitter moiety.

3. The device of claim 2, where the substrate further comprises a third region that comprises a third brush polymer disposed on the substrate; where the third brush polymer comprises repeat units of the first ethylenically unsaturated monomer and/or the second ethylenically unsaturated monomer; where the first ethylenically unsaturated monomer comprises a fifth electroactive moiety and where the second ethylenically unsaturated monomer comprises a sixth electroactive moiety.

4. The device of claim 3, where the first region, the second region and the third region are separated from each other and where the first electroactive moiety, the second electroactive moiety, the third electroactive moiety, the fourth electroactive moiety, the fifth electroactive moiety and the sixth electroactive moiety are chemically different from each other and are at least one selected from a host moiety, a hole transport layer moiety, a hole injection layer moiety, an emitter moiety or an electron transport layer moiety.

5. The device of claim 1, where the plurality of brush polymers form an emissive layer that emits fluorescent light and/or phosphorescent light.

6. The device of claim 5, where the plurality of brush polymers further form at least one of a host emission layer, a hole transport layer, a hole injection layer and/or an electron transport layer in addition to the emissive layer; and where at least one of the host emission layer, a hole transport layer, a hole injection layer and/or an electron transport layer contact the emissive layer.

7. The device of claim 6, further comprising an anode and a cathode; and where the device is an electroemissive device.

8. The device of claim 7, wherein the said device comprises a display that comprises light emitting pixels that are activated to display individual colors or color combinations.

9. The device of claim 8, wherein the device is a light source that emits light of a single color or of a plurality of colors.

10. The device of claim 9, wherein the device emits white light.

11. The device of claim 9, where the emitted light is transmitted through a color conversion layer.

12. The device of claim 11 wherein the color conversion layer comprises a multiplicity of pixels of a multiplicity of colors.

13. The device of claim 3, where the first region, the second region and the third region each produce light of different wavelengths respectively.

14. The device of claim 1, where the device is a light emitting diode.

15. The device of claim 1, where the device is a white organic light emitting diode.

* * * * *